(12) United States Patent
Shieh et al.

(10) Patent No.: US 7,219,292 B2
(45) Date of Patent: May 15, 2007

(54) CYCLIC REDUNDANCY CHECK MODIFICATION FOR LENGTH DETECTION OF MESSAGE WITH CONVOLUTIONAL PROTECTION

(75) Inventors: Shin-Lin Shieh, Hsinchu (TW);
Po-Ning Chen, Hsinchu (TW);
Yunghsiang S. Han, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 117 days.

(21) Appl. No.: 11/105,413

(22) Filed: Apr. 14, 2005

(65) Prior Publication Data

US 2006/0236211 A1    Oct. 19, 2006

(51) Int. Cl.
*H03M 13/29*    (2006.01)
(52) U.S. Cl. .................. 714/756; 714/776; 714/779
(58) Field of Classification Search ............... 714/758, 714/776, 779
See application file for complete search history.

(56) References Cited

U.S. PATENT DOCUMENTS

| | | | |
|---|---|---|---|
| 4,720,829 A * | 1/1988 | Fukasawa et al. .......... | 714/701 |
| 5,778,316 A * | 7/1998 | Persson et al. ............. | 455/434 |
| 5,896,374 A | 4/1999 | Okumura et al. | |
| 6,108,384 A | 8/2000 | Okumura et al. | |
| 6,216,107 B1 * | 4/2001 | Rydbeck et al. ........... | 704/500 |
| 6,493,844 B1 * | 12/2002 | Kanasugi et al. ........... | 714/781 |
| 6,804,220 B2 * | 10/2004 | Odenwalder et al. ....... | 370/337 |
| 6,954,885 B2 * | 10/2005 | Hurt et al. .................. | 714/755 |
| 7,020,824 B2 * | 3/2006 | Tanaka et al. .............. | 714/755 |
| 7,088,792 B2 * | 8/2006 | Rick .......................... | 375/341 |
| 7,093,178 B2 * | 8/2006 | Kim et al. .................. | 714/748 |
| 7,093,181 B2 * | 8/2006 | Kim et al. .................. | 714/758 |
| 7,127,661 B2 * | 10/2006 | Yoon et al. ................. | 714/774 |

OTHER PUBLICATIONS

Glover, N., et al., "Practical Error Correction Design for Engineers", 2nd ed., 1988, Data Systems Technology, pp. 261-265.*
Yukihiko Okumura et al., "Variable-Rate Data Transmission with Blind Rate Detection for Coherent DS-CDMA Mobile Radio," IEICE Trans. Commun., vol. E81-B, No. 7, Jul. 1998, pp. 1365-1373.

(Continued)

*Primary Examiner*—Stephen M. Baker
(74) *Attorney, Agent, or Firm*—Finnegan, Henderson, Farabow, Garrett & Dunner, L.L.P.

(57) ABSTRACT

In a method for a variable-length communications system including encoding a message and decoding a data bit stream, the message includes a plurality of message blocks. A message block of the message is encoded by generating a parity check bit stream, flipping the parity check bit stream, appending the flipped parity check bit stream and a number of 0's to the end of the message block, and convolutionally encoding the resultant bit stream. When a data bit stream is received, a guessed message block and a guessed flipped parity check bit stream are extracted based on a guessed message block length. A parity check bit stream is generated for the guessed message block and then flipped. If the flipped parity check bit stream is the same as the guessed flipped parity check bit stream, the message block has been identified. Otherwise, the guessed message block length is increased by 1 and the above step is repeated.

50 Claims, 13 Drawing Sheets

OTHER PUBLICATIONS

Shin-Lin Shieh et al., "A Novel Modification of Cyclic Redundancy Check for Message Length Detection," International Symposium on Information Theory and its Applications, ISITA 2004, Parma, Italy, Oct. 10-13, 2004.

3GPP TS 25.212 V3.11.0 (Sep. 2002), 3$^{rd}$ Generation Partnership Project; Technical Specification Group Radio Access Network; Multiplexing and channel coding (FDD), Release 1999, pp. 1-62.

* cited by examiner

CYCLIC REDUNDANCY CHECK MODIFICATION FOR LENGTH DETECTION OF MESSAGE WITH CONVOLUTIONAL PROTECTION

DESCRIPTION OF THE INVENTION

1. Field of the Invention

This invention is in general related to a cyclic redundancy check method for message length detection in a variable-length communications system and, more particularly, to a modified cyclic redundancy check method that has a low false detection probability for a variable-length communications system utilizing a convolutional coding method.

2. Background of the Invention

In a digital communications system, such as a CDMA (Code Division Multiple Access) system, a data bit stream comprising a stream of binary bits representing a message is transmitted by a transmitter, travels through a data channel, and is received by a receiver. The data bit stream is generally composed of a number of message blocks. If the length of a message block is not fixed, the system may be referred to as a variable-length communications system. In such a variable-length system, additional length information of each message block is generally required for the receiver to identify each message block and extract the message from the received data bit stream. A conventional method of a variable-length communications system designates a separate channel as a control channel for transmitting length information of each message block. Thus, when the receiver receives both the length information and the data bit stream, the receiver identifies the corresponding message blocks based on the length information, and de-blocks the data bit stream.

The conventional method also generally utilizes cyclic redundancy check (CRC) bits for error detection purposes. In particular, a fixed number of CRC bits are appended to the end of each message block and have a predetermined relationship with the corresponding message block. The receiver receives both the message block and the CRC bits following that message block, and tries to re-establish the relationship therebetween. If the relationship is satisfied, the message block is considered without error. Otherwise, an error has occurred during the transmission of that block. This method is further explained in greater detail next.

First, a CRC generating polynomial, $g_f(x)$, of order l, is chosen. A common way of choosing the CRC generating polynomial is that $g_f(x)$ should satisfy $\gcd(g_f(x),x^i)=1$ for each and every i between 0 and l, inclusive, wherein l and i are integers, and the function $\gcd(A(x),B(x))$ is defined as the greatest common divider of polynomials $A(x)$ and $B(x)$. Examples of suitable $g_f(x)$ include $g_4(x)=x^4+x^3+x^2+x+1$ for $l=4$; $g_7(x)=x^7+x^6+x^4+1$ for $l=7$; $g_8(x)=x^8+x^7+x^4+x^3+x+1$ for $l=8$; and $g_{12}(x)=x^{12}+x^{11}+x^3+x^2+x+1$ for $l=12$. The information regarding the CRC generating polynomial is stored in both the transmitter and the receiver.

For illustrative purposes, a binary polynomial is defined for each binary bit stream as follows: if a binary bit stream A includes t binary bits, $a_{t-1}, a_{t-2}, \ldots, a_0$, wherein t is an integer, then the binary polynomial of A is denoted as $A(x)$ and $A(x)=a_{t-1}x^{t-1}+a_{t-2}x^{t-2}+\ldots+a_0$. Also for illustrative purposes, binary bit stream A is said to satisfy the CRC condition if $A(x)$ is divisible by $g_f(x)$. Two binary bit streams A and B are said to satisfy the CRC condition if $x^s A(x)+B(x)$ is divisible by $g_f(x)$, wherein s is the number of bits contained in bit stream B. It is well known to one skilled in the art that when, for example, a polynomial $A(x)$ is divisible by another polynomial $g_f(x)$, the remainder of $A(x)$ divided by $g_f(x)$ is 0, and it may be said that $g_f(x)$ divides $A(x)$, denoted as $g_f(x)|A(x)$.

Next, for a message block M containing k bits of binary information, $m_{k-1}, m_{k-2}, \ldots, m_0$, a parity check bit stream P including l parity check bits, or CRC bits, $p_{l-1}, p_{l-2}, \ldots, p_0$, is generated such that M and P satisfy the CRC condition, or $g_f(x)|(x^l M(x)+P(x))$. A parity check bit stream may also be called a parity block, a parity check block, or a CRC block. For each message block M, it may be proved that there is only one corresponding parity check bit stream P. The proof is understood by one skilled in the art and is not discussed in detail herein.

According to the standard CRC method, parity check bit stream P may be generated using either hardware or software. Examples of hardware implementations are shown in FIGS. 1–2, and an example of a software implementation is shown in FIG. 3. Both FIGS. 1 and 2 assume l=8 and CRC generating polynomial $g_f(x)=x^8+x^7+x^4+x^3+x+1$.

FIG. 1 illustrates a first hardware implementation of generating parity check bit stream P. Referring to FIG. 1, a feedback shift register circuit 100 is used for generating parity check bit stream P based on CRC generating polynomial $g_f(x)=x^8+x^7+x^4+x^3+x+1$. Circuit 100 includes a plurality of delay circuits 102, which may be implemented as flip-flops. The number of delay circuits 102 is equal to the order of $g_f(x)$, i.e., l=8. Thus, in FIG. 1, there are 8 delay circuits, $102_1, 102_2, \ldots, 102_8$. Several XOR gates 104 are inserted between delay circuits 102. Each XOR gate 104 corresponds to a coefficient of CRC generating polynomial $g_f(x)$. For example, as shown in FIG. 1, an XOR gate $104_1$ to the left side of the first delay circuit $102_1$ indicates that the coefficient of $x^0=1$ of $g_f(x)$ is 1; the absence of XOR gate 104 between delay circuits $102_2$ and $102_3$ indicates that the coefficient of $x^2$ of $g_f(x)$ is 0; and an XOR gate $104_5$ between delay circuits $102_7$ and $102_8$ indicates that the coefficient of $x^7$ of $g_f(x)$ is 1. A clock signal (not shown) shifts register circuit 100 from left to right one bit at a time. Also shown in FIG. 1 is that the output of delay circuit $102_8$ is fed back to each of XOR gates $104_1$–$104_5$. The parity check bit stream P is generated by feeding into the left side of circuit 100 the message block M followed by eight bits of 0. The output of delay circuit $102_8$ then comprises message block M followed by its corresponding parity check bit stream P.

A second hardware implementation of generating a parity check bit stream is illustrated in FIG. 2. Similarly, a feedback shift register circuit 200 includes a plurality of delay circuits 202, each of which may be implemented as a flip-flop circuit. Several XOR gates 204 are inserted between delay circuits 202 according to CRC generating polynomial $g_l(x)$. However, in contrast to FIG. 1, an XOR gate 204 is added to the right end of circuit 200, rather than the left end of circuit 200, and the message block M is input into the rightmost XOR gate 204. A switch 206 switches the output of feedback shift register circuit 200 between message block M and the output of the rightmost XOR gate 204. Feedback shift register circuit 200 first outputs message block M and then outputs the parity bits by switching switch 206 to the output of the rightmost XOR gate 204.

FIG. 3 illustrates a software implementation of generating parity check bit stream P. Rather than generating the parity check bit stream P bit by bit, a lookup table is used in the software implementation. The lookup table contains an entire list of CRC bit streams for all possible messages of a certain length. For example, when l=8, the lookup table includes $2^8=256$ entries of CRC bit streams, each bit stream containing eight binary bits. As shown in FIG. 3, a message including 3 bytes (24 bits), Byte 1, Byte 2, and Byte 3, is encoded using the lookup table. At step 302, Byte 1 is considered and the lookup table is searched for a matching entry for Byte 1. An XOR operation is performed on the outcome of the search and Byte 2 at step 304 to generate an intermediate CRC bit stream CRC 2. An entry that matches CRC2 is looked up in the lookup table (step 306) and is XOR'ed with Byte 3 (step 308), to generate the CRC bit stream, CRC 3, of the message.

The above three implementations will be readily understood by one skilled in the art and, therefore, the details thereof are not further discussed herein.

After the parity check bit stream P is generated, the parity check bits thereof are appended to the end of the message block M to form a concatenated bit stream C including k+l bits, $m_{k-1}, m_{k-2}, \ldots, m_0, p_{l-1}, p_{l-2}, \ldots, p_0$. In view of the above conditions, $g_l(x)$ divides $C(x)=x^l M(x)+P(x)$.

For each message block contained in the message, the above encoding process is repeated to generate a corresponding concatenated bit stream, and a data bit stream including the concatenated bit streams and length information of each message block are then transmitted through a data channel and a control channel, respectively.

At the receiver side, both the data bit stream and the length information are received. A received message block M' and a parity check bit stream P' are extracted based on the length information, wherein M' includes k bits, $m'_{k-1}, m'_{k-2}, \ldots, m'_0$, and P' includes l bits, $p'_{l-1}, P'_{l-2}, \ldots, p'_0$. The receiver then performs a so-called CRC test to determine if M' and P' satisfy the CRC condition. If the condition is satisfied, then the message block is considered received with no error.

A system using a separately designated control channel for transmitting length information as discussed above could be very inefficient when the data rate is slow. For example, in a standard UMTS (universal mobile telecommunications system) WCDMA (wideband code division multiple access) mode, AMR (Adaptive Multi-Rate) 12.2 kbps mode, the overhead for transmitting the length information may be as large as 3 kbps, or almost 25% of the total transmission rate of 12.2 kbps.

To reduce the overhead incurred by separately transmitting the length information, there has been proposed a CRC method (hereinafter "standard CRC method") that uses the CRC bits for message length detection, rather than transmitting the length information of each message block through a separate channel. According to the standard CRC method, the transmitter only transmits the data bit stream, and the receiver receives the data bit stream with no length information. Thus, the receiver may not directly identify the message blocks or extract the message. Instead, the receiver repeats a trial-and-error step to search the received data bit stream for a pair of a message block and a parity check bit stream that satisfy the CRC condition. First, the receiver guesses a number, for example, $\hat{k}$, as the block length, and treats the first $\hat{k}$ bits of the received bit stream as the message block, and the following l bits as a parity check bit stream. The receiver then performs the CRC test to determine if the guessed message block and the guessed parity check bit stream satisfy the CRC condition. If the result is affirmative, the receiver has successfully identified a message block and continues to identify the next message block. Otherwise, the message block has not been identified, the guessed block length $\hat{k}$ is increased by 1, and the CRC test is repeated. Theoretically, after a few trials, the correct message block will be identified.

However, the standard CRC method has an inherent problem of probable false detection. Assuming a noise-free transmission and a uniformly distributed message, the probability of a false detection by the standard CRC method is given by Expression (1):

$$P_F(i) = \begin{cases} 0, & \text{for } i = 0; \\ 2^{-i}, & \text{for } 1 \leq i \leq l-1; \\ 2^{-l}, & \text{for } i \geq l, \end{cases} \quad (1)$$

wherein $i=k-\hat{k}$ is the message length offset. A brief explanation of Expression (1) is provided next.

Since the transmission is assumed noise-free, all the bits transmitted are received without error. Therefore, if $i=k-\hat{k}=0$, the CRC condition is satisfied and a correct message block is identified. No false detection occurs, i.e., $P_F(0)=0$.

If $i=k-\hat{k}=1$, the wrongly guessed message block M' includes k−1 bits, $m_{k-1}, m_{k-2}, \ldots, m_1$, and the guessed parity block P' includes l bits, $m_0, p_{l-1}, p_{l-2}, \ldots, p_1$. The CRC test therefore decides whether $g_l(x)$ divides $$C'(x) = x^l M'(x) + P'(x) = m_{k-1}x^{l+k-2} + m_{k-2}x^{l+k-3} + $$
$$\cdots + m_1 x^l + m_0 x^{l-1} + p_{l-1}x^{l-2} + p_{l-2}x^{l-3} + \cdots + p_1.$$

Because $\gcd(g_l(x),x)=1$, deciding whether $g_l(x)|C'(x)$, is equivalent to deciding whether $g_l(x)|xC'(x)$. Comparing C'(x) with C(x), there is $xC'(x)=C(x)-p_0$. Thus, if $p_0=0$, because $g_l(x)|C(x)$, then $g_l(x)|xC'(x)$, and $g_l(x)|C'(x)$. The receiver regards the wrong message block M' as the correct message block, and there is a false detection. Otherwise, if $p_0=1$, the CRC condition is not satisfied, the receiver concludes that M' is not the correct message block, and there is no false detection. For a uniformly distributed message, the probability of $p_0=0$ is ½, and, therefore, the probability of a false detection is ½.

Similarly, if $1 < i \leq l-1$, the wrongly guessed message block M' includes k−i bits, $m_{k-1}, m_{k-2}, \ldots, m_i$, and the wrongly guessed parity block P' includes l bits, $m_{i-1}, m_{i-2}, \ldots, m_0, p_{l-1}, p_{l-2}, \ldots, p_i$. The CRC test therefore decides whether $g_l(x)$ divides $$C'(x) = x^l M'(x) + P'(x) = m_{k-1}x^{l-i+k-1} +$$
$$m_{k-2}x^{l-i+k-2} + \cdots + m_0 x^{l-i} + p_{l-1}x^{l-i-1} + p_{l-2}x^{l-i-2} + \cdots + p_i.$$

Comparing C'(x) with C(x), there is $$x^i C'(x) = C(x) - \sum_{j=0}^{i-1} p_j(x).$$

Because the order of $g_i(x)$, l, is greater than i, $g_i(x)$ does not divide $$\sum_{j=0}^{i-1} p_j(x),$$

unless $p_0=p_1=\ldots=p_{i-1}=0$. Further because $g_i(x)|C(x)$, and $\gcd(g_i(x),x^i)=1$, $g_i(x)|C'(x)$ is satisfied only when $p_0=p_1=\ldots=p_{i-1}=0$. Thus, the probability of a false detection when $1<i\leq l-1$ is equal to the probability of $p_0=p_1=\ldots=p_{i-1}=0$, which, for a uniformly distributed message, is $2^{-i}$.

Finally, if $i\geq l$, the guessed message block M' includes k–i bits, $m_{k-1}, m_{k-2}, \ldots, m_i$, and the guessed CRC bit stream P' includes, $m_{i-1}, m_{i-2}, \ldots, m_{i-l}$. Since there is only one possible CRC bit stream that corresponds to M', the probability of P' satisfying the CRC condition of $g_i(x)|(x^lM'(x)+P'(x))$, i.e., the probability of a false detection, is $2^{-l}$ for a uniformly distributed message block.

FIG. 4 shows a simulation result of the probability of passing the CRC test for the standard CRC method with different guessed message lengths. The simulation conditions include that the order of the CRC generating polynomial is 8 and that the actual message length is 15. As shown in FIG. 4, as the estimated message size approaches the actual message length, i.e., the length offset i approaches 0, the probability of passing the CRC test increases exponentially.

In view of the large probability of false detection for a standard CRC method, a modified CRC method ("conventional modification") with a reduced probability of false detection has been proposed. According to the conventional modification of the CRC method, after the parity check bit stream P is generated, the parity check bits are appended to the message block in a reversed order, to form a concatenated bit stream, $m_{k-1}, m_{k-2}, \ldots, m_0, p_0, p_1, \ldots, P_{l-1}$. FIG. 5 shows simulation results for the conventional modification as compared to the standard CRC method. The conditions are the same as those in FIG. 4, i.e., the order of the CRC generating polynomial is 8 and the actual message length is 15. As shown in FIG. 5, the probability of passing the CRC test, i.e., the probability of false detection is reduced to $2^{-l}$ for all message length offset i>0.

If the data channel is noisy, errors will occur during the transmission. To protect the safe transmission of data, a method called convolutional coding may be applied to encode the data prior to the transmission thereof. At the receiver side, a corresponding decoding method is applied to decode the received data.

Conceptually, the convolutional coding method encodes the data to generate redundant bits of information and therefore sacrifices bit rate for improved transmission accuracy. According to the convolutional coding method, a convolutional coder receives message blocks to be transmitted and through an encoding process generates a bit stream including a plurality of portions each corresponding to a message block. Each portion may be referred to as a convolutional code word, or code word. The convolutional code word is then transmitted by the transmitter. The convolutional coder may at one time receive t bits of a message block and generate n bits of output, wherein n is generally greater than t. Each of the n bits of output may be a linear combination of the t bits of input and one or more prior bits preceding the t bits of input. The convolutional coder includes a number of memory registers to remember such prior bits and to receive the t bits of input and a plurality of logic gates connected to the memory registers in a manner consistent with an encoding algorithm to generate the n bits of output. A memory order of the convolutional coder is defined as the number of memory registers for each of the input t bits. A convolutional coder having an order j, receiving t bits of input, and outputting n bits of output may be referred to as an (n, t, j) coder. Apparently, an (n, t, j) coder has tj memory registers for storing the prior bits and t memory registers for receiving the one bit of input. In a special case, an (n, 1, j) coder has j memory registers for storing the prior bits and one memory register for receiving the one bit of input. Because each memory register stores either a 0 or a 1, there are $2^j$ possible states of such memory registers, i.e., there are $2^j$ possible states of the coder.

Consider a message block A having k bits. On the transmitter side, prior to coding message block A, an (n, 1, j) coder is at a beginning state. After coding message block A, the coder is at an end state. Apparently, given a beginning state, there is only one corresponding end state. It is common to set the beginning state as an all-zero state, in which all memory registers, except the one for receiving the one bit of input, have a bit of 0 stored therein. As a result of the encoding process, a code word including n(k+j) bits is generated.

On the receiver side, a decoder such as a Viterbi decoder may be used to decode a received code word including n(k+j) bits. Generally, the decoder knows in advance the beginning state of the coder. For a k-bit message block, there are $2^k$ possible code words. The decoder compares these $2^k$ possible code words with the received code word and finds the best match. In an error-free system, there should be one code word that completely matches the received code word. However, in a noisy system, it is possible no one of the $2^k$ possible code word completely matches the received code word. A path metric of a possible code word is defined as the number of bits of the possible code word matching those of the received code word. The decoder tries to find the possible code word having the best path metric. The message block corresponding to that code word with the best path metric is considered as the decoded message block. Depending on which decoding algorithm is applied, different decoders may have different efficiencies in finding the best path metric. For example, compared with a sequential decoder, a Viterbi decoder generally has a better efficiency. The sequential decoder and Viterbi decoder are well-known to one skilled in the art and are not described herein.

In a variable-length system, the length of each message block and the length of the corresponding code word are unknown. Therefore, the convolutional decoder does not know when to stop the decoding process. Accordingly, extra bits may be inserted to the message block before the convolutional encoding process for that message block. For example, for an (n, 1, j) coder, j bits of 0 may be appended to the end of each message block. As a result, the coder returns to the all-zero state at the end of the encoding process. In the decoding process, the decoder guesses a length $\tilde{k}$ of the message block, and determines if the one of the $2^{\tilde{k}}$ possible code words having the best path metric corresponds to an end state of all-zero. If affirmative, $\tilde{k}$ is considered as the correct length of the message block. Otherwise, the decoder increases $\tilde{k}$ by 1 and repeats the above process.

A message block may be encoded using both the CRC method (either the standard CRC method or the conventional modification thereof) and the convolutional method.

For example, after the standard CRC encoding process discussed above, a concatenated bit stream C including a message block M including k bits, $m_{k-1}, m_{k-2}, \ldots, m_0$, and a corresponding parity check bit stream P including l bits, $p_{l-1}, p_{l-2}, \ldots, p_0$, may be sent to a convolutional (n, 1, j) coder, which generates a code word including n(k+l) bits.

A decoder on the receiver side also decodes the received code word using both the convolutional method and the CRC method. Particularly, a Viterbi decoder convolutionally decodes the received code word and finds a putative concatenated bit stream $\hat{C}$ including $\hat{k}$+l bits. Then the putative concatenated bit stream $\hat{C}$ is sent to a CRC decoder where the CRC test is performed. If the CRC test is passed, the putative concatenated bit stream $\hat{C}$ is considered as containing the correct message block M. Otherwise, $\hat{k}$ is increased by 1 and the above process is repeated.

SUMMARY OF THE INVENTION

The present invention provides for a modified CRC method for length detection of a message with convolutional protection.

Consistent with the present invention, there is provided a method for a variable-length communications system, wherein messages to be transmitted are divided into variable-length message blocks. The method includes providing a cyclic redundancy check (CRC) generating polynomial, providing a binary flip polynomial, and encoding a message block of a message to be transmitted. A message block of the message is encoded by generating a parity check bit stream, flipping the parity check bit stream, appending the flipped parity check bit stream and a number of 0's to the end of the message block, and convolutionally encoding the resultant bit stream.

Consistent with the present invention, there is also provided a method for a variable-length communications system, wherein the system includes a receiver. The method includes storing in the receiver information of a cyclic redundancy check (CRC) generating polynomial and information of a flip polynomial, receiving a data bit stream including a plurality of code words, each code word corresponding to a concatenated bit stream consisting of a message block and a corresponding flipped parity check bit stream; and decoding a first message block in the data bit stream. The first message block is decoded by (a) guessing a message block length and generating a concatenated bit stream including a guessed message block and a guessed flipped bit stream, (b) generating a parity check bit stream for the guessed message block using the CRC generating polynomial, (c) flipping the parity check bit stream using flip polynomial to generate a flipped parity check bit stream, and (d) if the flipped parity check bit stream and the guessed flipped parity check bit stream are different, increasing $\hat{k}$ by 1 and repeating steps (a)–(c).

Consistent with the present invention, there is further provided a method for a variable-length communications system including encoding a message and decoding a data bit stream, wherein the message includes a plurality of message blocks. A message block of the message is encoded by generating a parity check bit stream, flipping the parity check bit stream, appending the flipped parity check bit stream and a number of 0's to the end of the message block, and convolutionally encoding the resultant bit stream. When a data bit stream is received, a guessed message block and a guessed flipped parity check bit stream are extracted based on a guessed message block length. A parity check bit stream is generated for the guessed message block and then flipped. If the flipped parity check bit stream is the same as the guessed flipped parity check bit stream, the message block has been identified. Otherwise, the guessed message block length is increased by 1 and the above step is repeated.

Consistent with the present invention, there is also provided a variable-length communications system that includes a transmitter for encoding messages into a data bit stream and then transmitting the data bit stream, the messages being divided into variable-length message blocks, a data channel for passing the data bit stream comprising the encoded messages; and a receiver for receiving the data bit stream and decoding the messages. The encoding of the messages includes encoding a message block of the messages and encoding the message block includes generating a parity check bit stream using a CRC generating polynomial, flipping the parity check bit stream to generate a flipped parity check bit stream using a flip polynomial, appending the flipped parity check bit stream to the end of the corresponding message block to create a concatenated bit stream, and convolutionally encoding the concatenated bit stream to generate a code word. Also the decoding of the messages includes decoding a message block of the messages contained in the received data bit stream and decoding the message block includes guessing a message block length, generating a concatenated bit stream from the received data bit stream, the concatenated bit stream including a guessed message block and a guessed flipped parity check bit stream, generating a parity check bit stream using the CRC generating polynomial, flipping the parity check bit stream using the flip polynomial to generate a flipped parity check bit stream, if the flipped parity check bit stream and the guessed flipped parity check bit stream are different, increasing the guessed message block length by 1 and returning to the generating of the concatenated bit stream, and if the flipped parity check bit stream and the guessed flipped parity check bit stream are the same, removing the code word of the corresponding message block from the data bit stream.

Additional features and advantages of the invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings.

DESCRIPTION OF THE EMBODIMENTS

Figure 1:
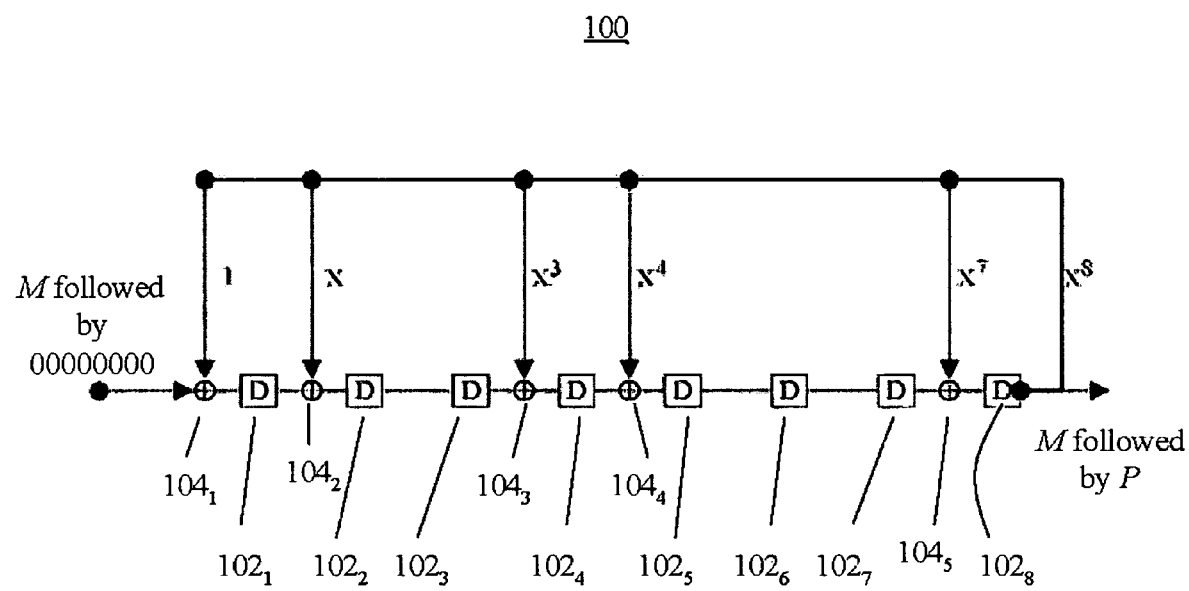
FIG. 1 illustrates a first hardware implementation of generating a parity check bit stream according to the standard CRC method.
Figure 2:
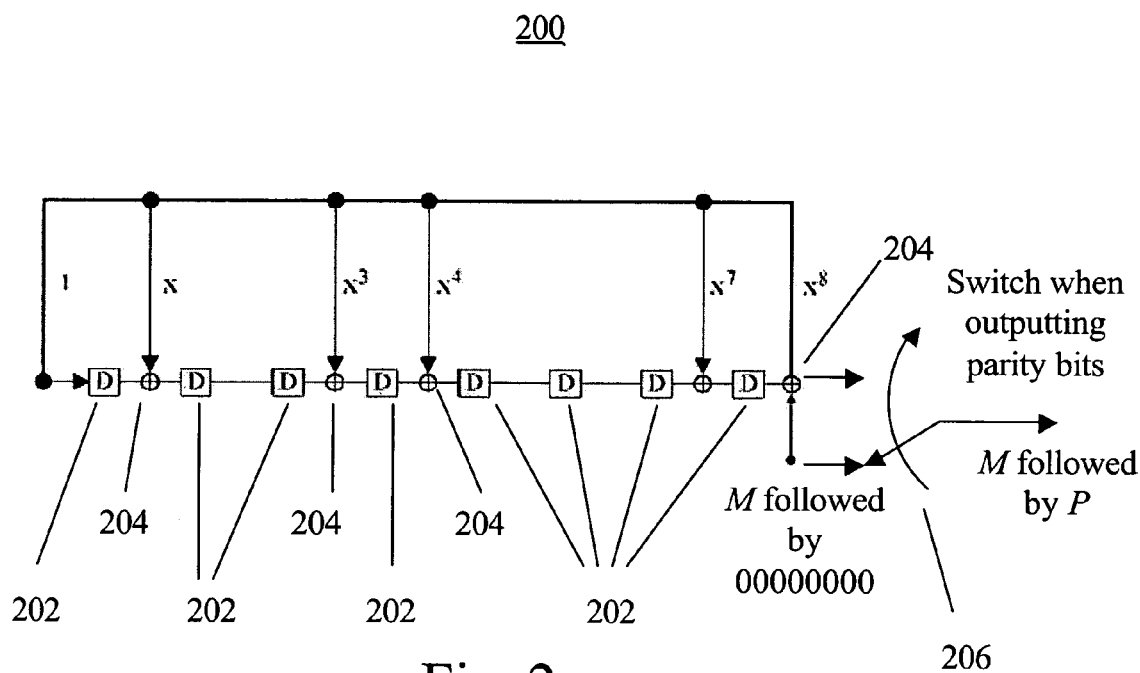
FIG. 2 illustrates a second hardware implementation of generating a parity check bit stream according to the standard CRC method.
Figure 3:
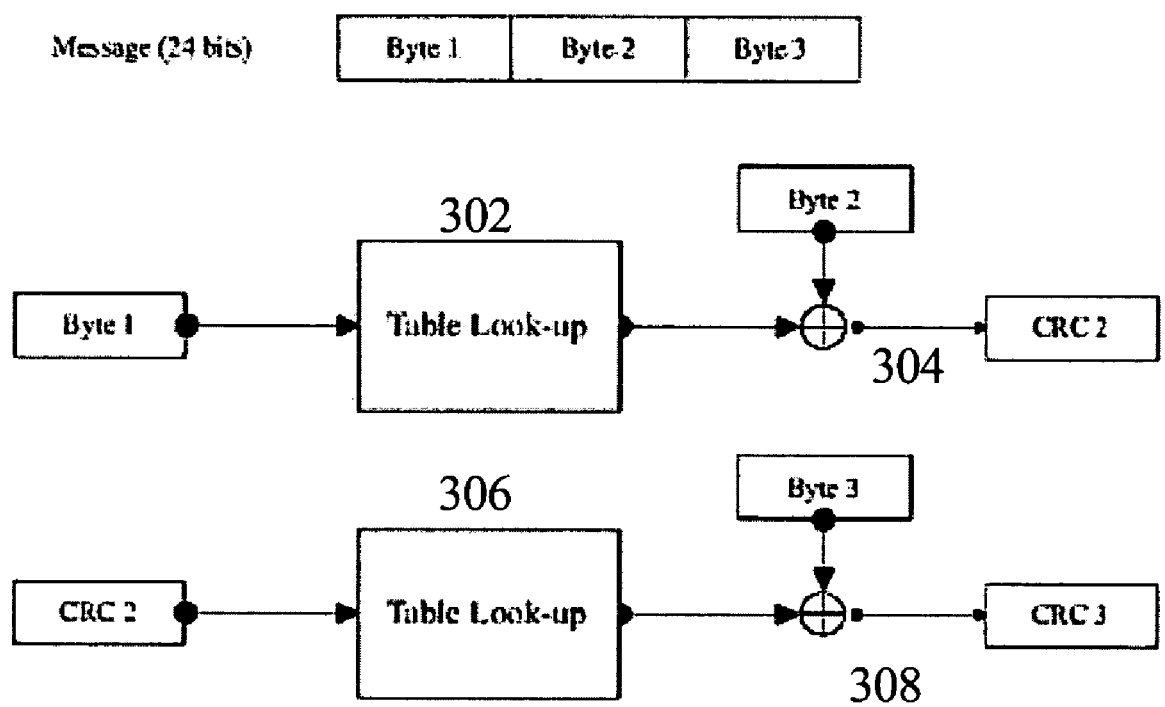
FIG. 3 illustrates a software implementation of generating a parity check bit stream according to the standard CRC method.
Figure 4:
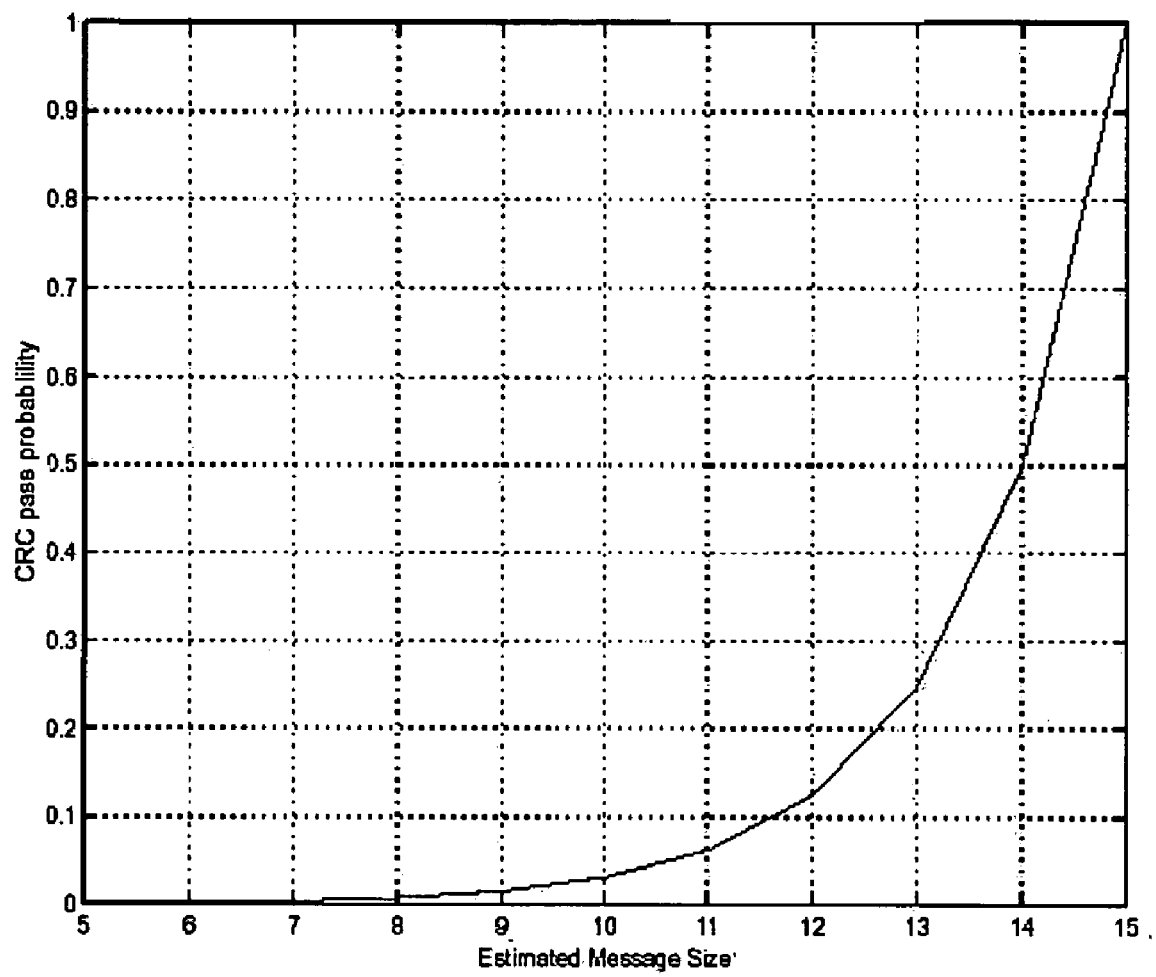
FIG. 4 shows simulation results of the standard CRC method.
Figure 5:
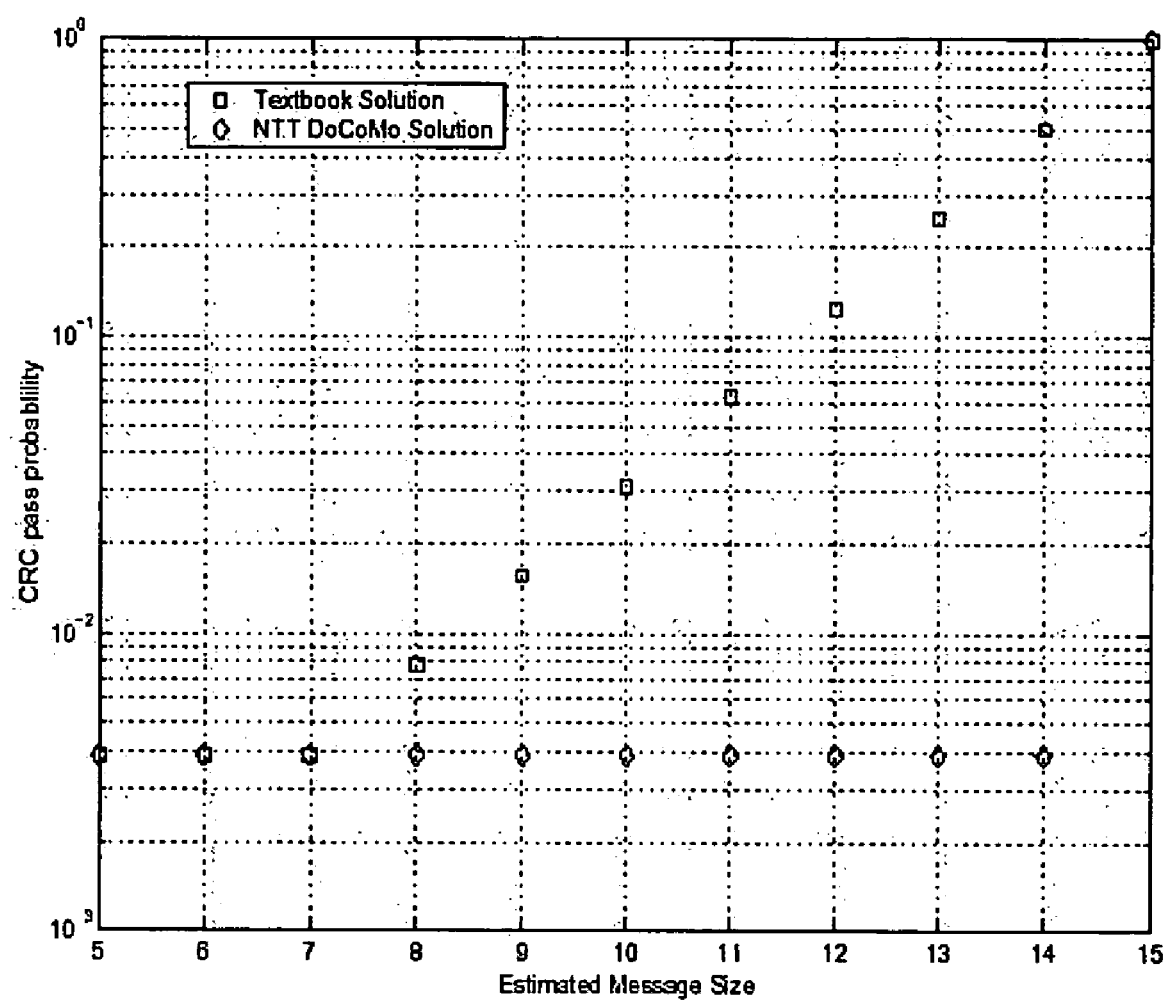
FIG. 5 shows simulation results of a conventional modification of the CRC method.

Reference will now be made in detail to preferred embodiments of the invention, examples of which are illustrated in the accompanying drawings. Wherever possible, the same reference numbers will be used throughout the drawings to refer to the same or like parts.

Embodiments consistent with the present invention provide a modified CRC method for length detection of a message having convolutional protection.

Particularly, methods consistent with the present invention are suitable for use in a variable-length communications system, which includes a transmitter and a receiver. A message to be transmitted may include a number of message blocks having non-fixed lengths. Each message block is encoded with both the CRC method and the convolutional method and transmitted by the transmitter. When the receiver receives the encoded message blocks, each message block is decoded and the message is extracted. Since the method of encoding and decoding is the same for all the message blocks, only one message block M including k bits, $m_{k-1}, m_{k-2}, \ldots, m_{k-1}, m_0$, is considered in the following description.

For illustrative purposes, a binary polynomial is defined for each binary bit stream as follows: if a binary bit stream A includes t binary bits, $a_{t-1}, a_{t-2}, \ldots, a_0$, wherein t is an integer, the binary polynomial of A is denoted as $A(x)$ and $A(x)=a_{t-1}x^{t-1}+a_{t-2}x^{t-2}+\ldots+a_0$. It is assumed that, unless otherwise indicated, hereinafter, when two binary polynomials are added, coefficients of the two polynomials corresponding to the same power are added according to a modulo-2 addition operation. A modulo-2 addition is defined as a binary addition with no carry, for example, $0+1=1$, and $1+1=0$. Thus, if bit stream B includes s binary bits, $b_{s-1}, b_{s-2}, \ldots, b_0$, then, assuming $s<t$, $A(x)+B(x)=a_{t-1}x^{t-1}+a_{t-2}x^{t-2}+\ldots+a_s x^s+(a_{s-1}+b_{s-1})x^{s-1}+(a_{s-2}+b_{s-2})x^{s-2}+\ldots+(a_0+b_0)$, wherein $a_i+b_i$ gives the result of modulo-2 addition of $a_i$ and $b_i$, for $0 \leq i \leq s-1$. It is also assumed that, unless otherwise indicated, hereinafter, when two binary bit streams are added, the corresponding bits of the two bit streams are added according to modulo-2 addition operation. It is also well known to one skilled in the art that, according to the definition of modulo-2 addition, there are $a+b+b=a$, $A+B+B=A$, and $A(x)+B(x)+B(x)=A(x)$, wherein a and b are binary bits, and A and B are binary bit streams.

A method consistent with the present invention starts by choosing two binary polynomials, a CRC generating polynomial (hereinafter "CRC polynomial"), $g_l(x)$, and a flip polynomial $f_l(x)$. CRC polynomial $g_l(x)$ has an order of l, and flip polynomial $f_l(x)$ has an order of l−1, wherein l is an integer. In one aspect, $\gcd(g_l(x), x^i)=1$ for each and every $0 \leq i \leq l$, wherein i is an integer, and $\gcd(g_l(x), x^i)$ is the greatest common divider of $g_l(x)$ and $x^i$. Examples of suitable $g_l(x)$ include $g_4(x)=x^4+x^3+x^2+x+1$ for $l=4$; $g_7(x)=x^7+x^6+x^4+1$ for $l=7$; $g_8(x)=x^8+x^7+x^4+x^3+x+1$ for $l=8$; and $g_{12}(x)=x^{12}+x^{11}+x^3+x^2+x+1$ for $l=12$. Flip polynomial $f_l(x)$ may be expressed as $f_l(x)=f_{l-1}x^{l-1}+f_{l-2}x^{l-2}+\ldots+f_0$, wherein $f_i \in \{0,1\}$ for $0 \leq i \leq l$. The coefficients of flip polynomial $f_l(x)$, namely, $f_{l-1}, f_{l-2}, \ldots, f_0$, may be referred to as flip bits. The information of CRC polynomial $g_l(x)$ and flip polynomial $f_l(x)$ is stored in both the transmitter and the receiver.

For illustrative purposes, a binary bit stream A is said to satisfy the CRC condition if $g_l(x)$ divides $A(x)$, or $g_l(x)|A(x)$; and two binary bit streams A and B are said to satisfy the CRC condition if $g_l(x)$ divides $x^s A(x)+B(x)$, or $g_l(x)|(x^s A(x)+B(x))$, wherein s is the number of bits contained in bit stream B.

On the transmitter side, an encoding process first generates a parity check bit stream P including l parity check bits, or CRC bits, $p_{l-1}, p_{l-2}, \ldots, p_0$, such that M and P satisfy the CRC condition, or $g_l(x)|(x^l M(x)+P(x))$, wherein $M(x)=m_{k-1}x^{k-1}+m_{k-2}x^{k-2}+\ldots+m_0$, and $P(x)=p_{l-1}x^{l-1}+p_{l-2}x^{l-2}+\ldots+p_0$. Parity check bit stream P may also be referred to as a parity check block, a parity block, or a CRC block. One skilled in the art will now appreciate that each message block M corresponds to only one unique parity check bit stream P.

The encoding process then flips the parity check bits according to flip polynomial $f_l(x)$, or, specifically, by performing a modulo-2 addition of each bit in the parity check bit stream P and a corresponding flip bit. The resultant flipped parity check bit stream $\overline{P}$ thus includes l flipped parity check bits: $\overline{p_{l-1}}=p_{l-1}+f_{l-1}, \overline{p_{l-2}}=p_{l-2}+f_{l-2}, \ldots, \overline{p_0}=p_0+f_0$. In effect, if $f_i=1$, then $\overline{p_i}$ is the flip of $p_i$; if $f_0=1$, then $\overline{p_i}$ is the same as $p_i$.

Then, the flipped parity check bits are appended to the end of the message block to form a concatenated bit stream C including k+l bits, $m_{k-1}, m_{k-2}, \ldots, m_0, \overline{p_{l-1}}, \overline{p_{l-2}}, \ldots, \overline{p_0}$.

Figure 6:
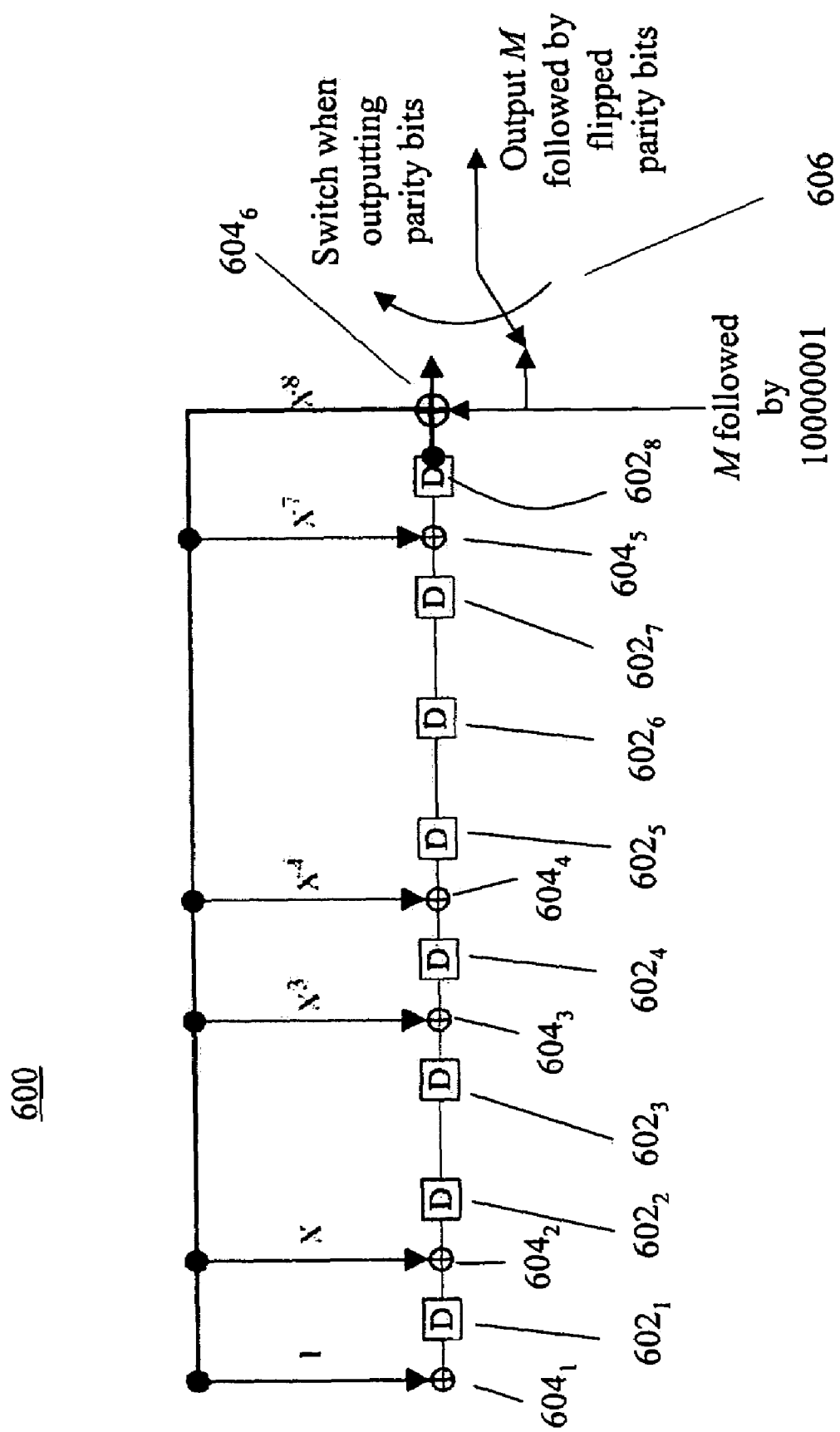
FIG. 6 illustrates a first hardware implementation of generating a flipped parity check bit stream consistent with embodiments of the present invention.

Consistent with the present invention, the flipped parity check bits may be generated through hardware or software. FIG. 6 illustrates a first hardware implementation for generating the flipped parity check bits according to an embodiment consistent with the present invention. Referring to FIG. 6, a feedback shift register circuit 600 is used for generating flipped parity check bit stream $\overline{P}$ based on CRC generating polynomial $g_l(x)=x^8+x^7+x^4+x^3+x+1$. Circuit 600 includes a plurality of delay circuits 602, which may be implemented as flip-flops. The number of delay circuits 602 is equal to the order of $g_l(x)$, i.e., l=8. Thus, in FIG. 6, there are 8 delay circuits, $602_1$, $602_2$, ..., $602_8$. Several XOR gates 604 are inserted between delay circuits 602. Each XOR gate 604 corresponds to a coefficient of CRC generating polynomial $g_l(x)$. For example, as shown in FIG. 6, an XOR gate $604_1$ to the left side of the first delay circuit $602_1$ indicates that the coefficient of $x^0=1$ of $g_l(x)$ is 1; the absence of XOR gate 604 between delay circuits $602_2$ and $602_3$ indicates that the coefficient of $x^2$ of $g_l(x)$ is 0; and an XOR gate $604_5$ between delay circuits $602_7$ and $602_8$ indicates that the coefficient of $x^7$ of $g_l(x)$ is 1. An XOR gate $604_6$ is also coupled to XOR the output of delay circuit $602_8$ with the message block M followed by flip bits $f_{l-1}$, $f_{l-2}$, ..., $f_0$. According to the expression for $f_l(x)$ previously described and as shown in FIG. 6, $f_8(x)=x^7+1$. Thus, the corresponding 8 flip bits are 10000001. A clock signal (not shown) shifts register circuit 600 from left to right one bit at a time. Also shown in FIG. 6 is that the output of XOR gate $604_6$ is fed back to each of XOR gates $604_1$–$604_5$. A switch 606 switches the output of feedback shift register circuit 600 between message block M and the output of XOR gate $604_6$. Feedback shift register circuit 600 first outputs message block M and then outputs the flipped parity bits by switching switch 606 to the output of XOR gate $604_6$.

Figure 7:
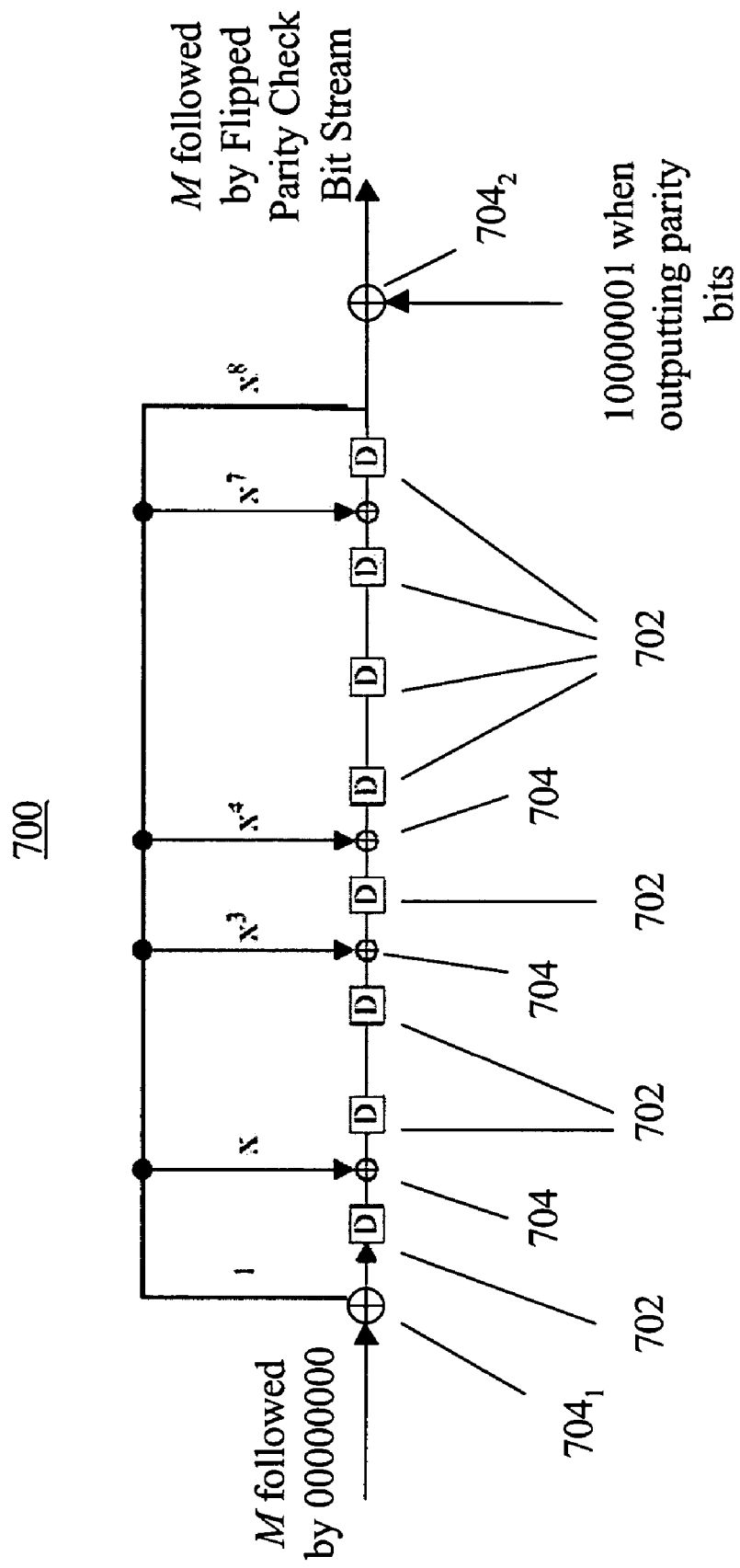
FIG. 7 illustrates a second hardware implementation of generating a flipped parity check bit stream consistent with embodiments of the present invention.

A second hardware implementation for generating flipped parity check bit stream $\overline{P}$ consistent with an embodiment of the present invention is illustrated in FIG. 7. As shown in FIG. 7, a feedback shift register circuit 700 includes a plurality of delay circuits 702, each of which may be implemented as a flip-flop circuit. Several XOR gates 704 are inserted between delay circuits 702 according to CRC generating polynomial $g_l(x)$. Two XOR gates $704_1$ and $704_2$ are added to the left and right ends of circuit 700, respectively. The message block M is input into XOR gate $704_1$, and the rightmost delay circuit 702 outputs message block M and its corresponding parity check bit stream P. XOR gate $704_2$ then flips the parity check bit stream P using the flip bits, $f_{l-1}$, $f_{l-2}$, ..., $f_0$, to generate the flipped parity check bit stream $\overline{P}$. It is also assumed in FIG. 7 that the flip polynomial is $f_8(x)=x^7+1$, and therefore the flip bits are 10000001.

Figure 8:
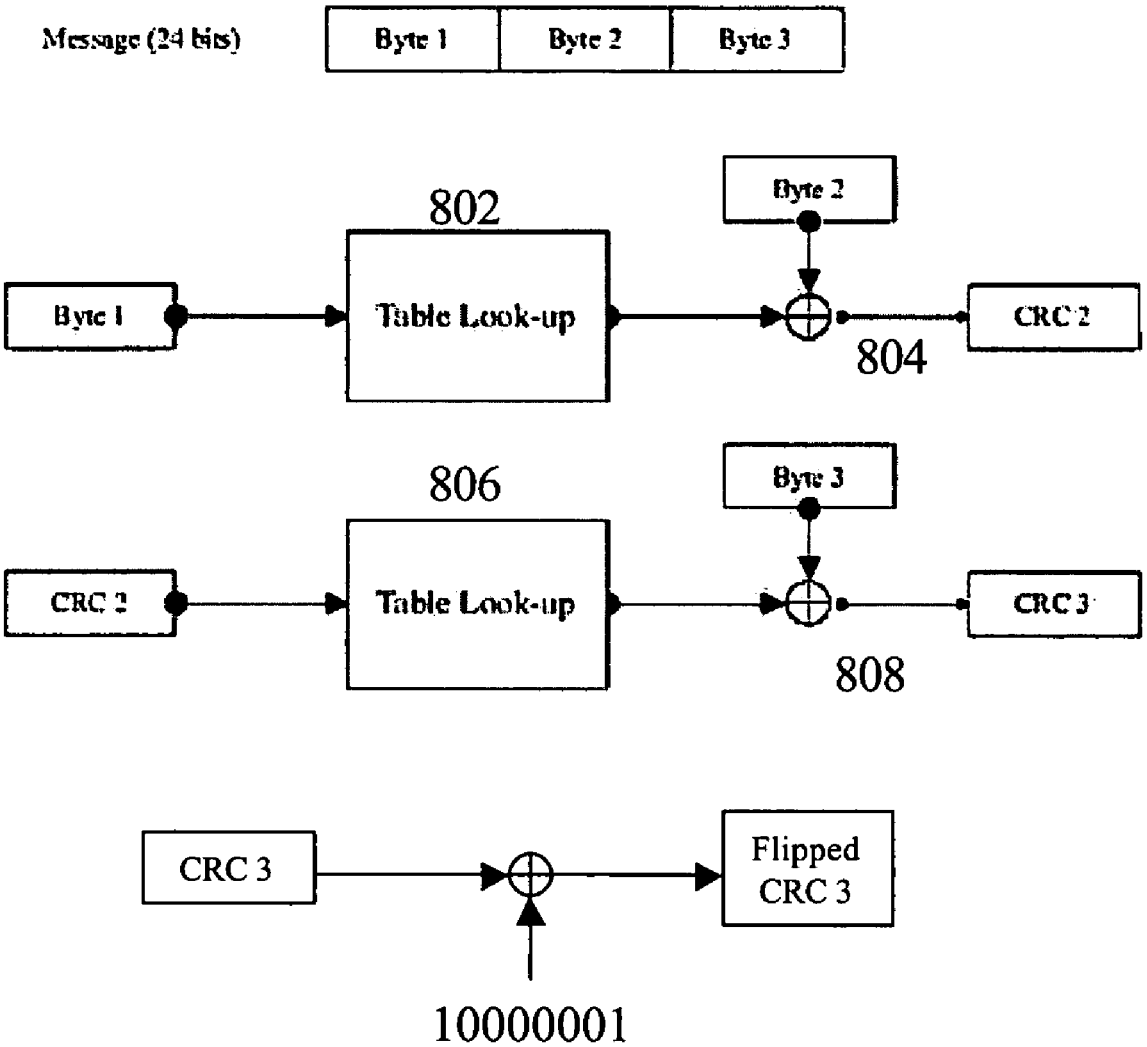
FIG. 8 illustrates a software implementation of generating a flipped parity check bit stream consistent with embodiments of the present invention.

FIG. 8 diagrammatically illustrates a software implementation of generating flipped parity check bit stream $\overline{P}$, wherein a lookup table is used in the software implementation. The lookup table contains an entire list of CRC bit streams for all possible messages of a certain length. For example, when l=8, the lookup table includes $2^8=256$ entries of CRC bit streams, each bit stream containing eight binary bits. As shown in FIG. 8, a message including 3 bytes (24 bits), Byte 1, Byte 2, and Byte 3, is encoded using the lookup table. At step 802, Byte 1 is considered and the lookup table is searched for a matching entry for Byte 1. An XOR operation is performed on the outcome of the search and Byte 2 at step 804 to generate an intermediate CRC bit stream CRC 2. An entry that matches CRC2 is looked up in the lookup table (step 806) and is XOR'ed with Byte 3 (step 808), to generate the CRC bit stream, CRC 3, of the message. Further, CRC 3 is flipped using the flip bits. It is also assumed in FIG. 8 that the flip polynomial is $f_8(x)=x^7+1$, and therefore the flip bits are 10000001.

After the above CRC encoding process, the concatenated bit stream C is further encoded by an (n, t, j) convolutional coder, where n is an integer representing how many bits are output at a time by the coder, t is an integer indicating the number of inputs the coder receives, and j is the memory order of the coder. For simplicity of illustration, it is assumed that t=1. First, the concatenated bit stream C is appended with j bits of 0 to create a 0-terminated bit stream B, which includes k+l+j bits, $m_{k-1}$, $M_{k-2}$, ..., $m_0$, $\overline{p_{l-1}}$, $\overline{p_{l-2}}$, ... $\overline{p_0}$, 0, 0, ..., 0 (j bits of 0 at the end). 0-terminated bit stream B is then passed through the (n, 1, j) convolutional coder to generate a convolutional code word D including n(k+l+j) bits. The convolutional encoding process is well-known to one skilled in the art and is not described in detail herein.

The same encoding process as above is performed to generate a convolutional code word for each of the other message blocks in the message, and a data bit stream including the resultant convolutional code words is transmitted.

When the receiver receives a data bit stream including at least a convolutional code word, a decoding process is performed to identify the first message block in the data bit stream. After the first message block is identified, the corresponding code word is removed from the data bit stream, and the receiver continues to identify the first message block in the resultant data bit stream. Thus, when the receiver starts to decode message block M, the data bit stream includes the convolutional code word D corresponding to message block M, followed by the corresponding convolutional code word of the next message blocks.

The decoding process includes a convolutional decoding process and a CRC decoding process. First, a message block M' having a length $\hat{k}$ is guessed and the decoder convolutionally decodes the first $n(\hat{k}+l+j)$ bits in the received data bit stream. In one aspect, $\hat{k}$ is chosen to be smaller than the length k of message block M. The decoder determines if the one of the $2^{\hat{k}+l+j}$ possible code words with the best path metric, or the best code word, corresponds to an end state of all-zero. If negative, $\hat{k}$ is increased by 1 and the above process is repeated. If affirmative, $\hat{k}$ is considered as the correct length of the message block and a putative concatenated bit stream $\hat{C}$ including $\hat{k}+l$ bits, $m_{k-1}$, $m_{k-2}$, ..., $m_{k-\hat{k}}$, $m_{k-\hat{k}-1}$, $m_{k-\hat{k}-2}$, ..., $m_0$, $\overline{p_{l-1}}$, $\overline{p_{l-2}}$, ..., $\overline{p_{k-\hat{k}}}$, is extracted and is subjected to the CRC test in the CRC decoding process.

In the CRC decoding process, a parity check bit stream $\hat{P}$ including l parity check bits, $\hat{p}_{l-1}$, $\hat{p}_{l-2}$, ..., $\hat{p}_0$, is first generated for the guessed message block M' such that $g_l(x)|(x^l M'(x)+\hat{P}(x))$. Second, using flip polynomial $f_l(x)$, the parity check bit stream $\hat{P}$ is flipped to generate a flipped parity check bit stream $\hat{P}'$, which includes l flipped parity check bits, $\hat{p}'_{l-1}=\hat{p}'_{l-1}+f_{l-1}$, $\hat{p}'_{l-2}=\hat{p}'_{l-2}+f_{l-2}$, ..., $\hat{p}'_0=\hat{p}_0+f_0$. Finally, the receiver compares the flipped parity check bit stream $\hat{P}'$ with the guessed flipped parity check bit stream $\overline{P}'$. If $\hat{P}'\neq\hat{P}^\uparrow$, the CRC test fails and no message block has been identified; the estimated length $\hat{k}$ is increased by 1, and the above path metric test and CRC test are repeated. If, otherwise, $\hat{P}'=\overline{P}'$, the CRC test is passed and it is considered that a message block has been correctly identified. The first $n(\hat{k}+l+j)$ bits constituting the code word corresponding to message block M' are removed from the data bit stream, and the receiver continues to decode the first message block in the resultant data bit stream.

A false detection occurs when first $n(\hat{k}+l+j)$ bits pass both the path metric test and the CRC test while $\hat{k}$ is not the correct length of message block M. In the following description, it is assumed that the guessed message block M' corresponds to a concatenated bit stream C' including $\hat{k}+l$ bits, a 0-terminated bit stream B' including $\hat{k}+l+j$ bits, and a code word D' including the first $n(\hat{k}+l+j)$ bits.

First, as discussed above, to pass the path metric test in an error-free channel, 1) D' must have the best path metric among those $2^{\hat{k}+l+j}$ possible code words each corresponding to a message block length of $\hat{k}$, and 2) D' must correspond to an all-zero end state of the coder, i.e., the coder returns to the all-zero state after encoding C'. For these two conditions to be satisfied, the last j bits of bit stream B' must all be 0's.

Second, for the putative concatenated bit stream C' to pass the CRC test, there must be $g_l(x)|(C'(x)+f_l(x))$.

By choosing a proper flip polynomial $f_l(x)$, the CRC method of the present invention may have a low probability of false detection. In one aspect, flip polynomial $f_l(x)$ is chosen such that $$deg\left(\text{remainder of}\left(\frac{(1+x^i)f_l(x)}{g_l(x)}\right)\right) \geq i-j, \text{ for } 1 \leq i \leq l+j-1. \quad (2)$$

For example, when $l=8$, $g_l(x)=x^8+x^7+x^4+x^3+x+1$, and a (2, 1, 8) convolutional coder is used, there are 66 different flip polynomials $f_l(x)$ that satisfy condition (2), an example of which is $f_l(x)=x^4+x$.

Under condition (2), and assuming both a uniformly distributed message and an error-free transmission, the probability of D' passing both the path metric test and the CRC test is given in Expression (3):

$$P_F(i) = \begin{cases} 0, & \text{for } 0 \leq i \leq l+j-1; \\ 2^{-(l+j)}, & \text{for } i \geq l+j, \end{cases} \quad (3)$$

wherein $i=k-\hat{k}$ is the message length offset. A brief proof of Expression (3) is given next.

When $i=0$, message block M' includes k bits, $m_{k-1}, m_{k-2}, \ldots, m_0$, and the corresponding flipped parity check block $\overline{P'}$ includes l bits, $\overline{p_{l-1}}, \overline{p_{l-2}}, \ldots \overline{p_0}$. B' includes M' followed by $\overline{P'}$ and j bits of 0's. Both the path metric test and the CRC test are passed, the correct message block is identified, and there is no false detection.

When $0<i\leq j$, M' includes $\hat{k}$ bits, $m_{k-1}, m_{k-2}, \ldots, m_i$, $\overline{P'}$ includes l bits, $m_{i-1}, m_{i-2}, \ldots, m_0, \overline{p_{l-1}}, \overline{p_{l-2}}, \ldots \overline{p_i}$, and B' includes M' and $\overline{P'}$, followed by j bits, $\overline{p_{i-1}}, \overline{p_{i-2}}, \ldots, \overline{p_0}$, and j-i 0's. For the path metric test to pass, the last j bits of bit stream B' must all be 0, i.e., $\overline{p_{i-1}}, \overline{p_{i-2}}, \ldots, \overline{p_0}$ are all 0's. For the concatenated bit stream C' to pass the CRC test, there must be $g_l(x)|(C'(x)+f_l(x))$, where $$C'(x)=m_{k-1}x^{l+\hat{k}-1}+m_{k-2}x^{l+\hat{k}-2}+ \ldots +m_0x^{l-i-1}+\overline{p_{l-1}}x^{l-i-1}+ \ldots +\overline{p_i}.$$

Comparing C'(x) with $C(x)=x^l M(x)+P(x)$, there is $$C(x) = (C'(x) + f_l(x))x^i + \sum_{s=0}^{i-1}\overline{p_s}x^s + f_l(x).$$

Because $g_l(x)|C(x)$ and $\gcd(g_l(x),x^i)=1$, $g_l(x)|C'(x)$ is satisfied if and only if $$g_l(x)\left|\left((1+x^i)f_l(x) + \sum_{s=0}^{i-1}\overline{p_s}x^s\right)\right.$$

Further, $$deg\left(\text{remainder of}\left(\frac{(1+x^i)f_l(x)}{g_l(x)}\right)\right) \geq i-j$$

(condition (2) above), and $$\sum_{s=0}^{i-1}\overline{p_s}x^s = 0$$

because $\overline{p_{i-1}}, \overline{p_{i-2}}, \ldots, \overline{p_0}$ must all be 0 for the path metric test to pass. Therefore, $$deg\left(\text{remainder of}\left(\frac{\left((1+x^i)f_l(x) + \sum_{s=0}^{i-1}\overline{p_s}x^s\right)}{g_l(x)}\right)\right) \geq i-j,$$

and $g_l(x)$ does not divide $$(1+x^i)f_l(x) + \sum_{s=0}^{i-1}\overline{p_s}x^s.$$

Therefore, the probability of both the path metric test and the CRC test being passed, i.e., the probability of a false detection, is 0.

When $j<i\leq l+j-1$, M' includes $\hat{k}$ bits, $m_{k-1}, m_{k-2}, \ldots, m_i$, $\overline{P'}$ includes l bits, $m_{i-1}, m_{i-2}, \ldots, m_0, \overline{p_{l-1}}, \overline{p_{l-2}}, \ldots, \overline{p_i}$, and B' includes M' and $\overline{P'}$, followed by j bits, $\overline{p_{i-1}}, \overline{p_{i-2}}, \ldots, \overline{p_{i-j}}$. For the path metric test to pass, the last j bits of bit stream B' must all be 0, i.e., $\overline{p_{i-1}}, \overline{p_{i-2}}, \ldots, \overline{p_{i-j}}$ are all 0's. For the concatenated bit stream C' to pass the CRC test, there must be $g_l(x)|(C'(x)+f_l(x))$, where $$C'(x)=m_{k-1}x^{l+\hat{k}-1}+m_{k-2}x^{l+\hat{k}-2}+ \ldots +m_0x^{l-i-1}+\overline{p_{l-1}}x^{l-i-1}+ \ldots +\overline{p_i}.$$

Comparing C'(x) with $C(x)=x^l M(x)+P(x)$, there is $$C(x) = (C'(x) + f_l(x))x^i + \sum_{s=0}^{i-1}\overline{p_s}x^s + f_l(x).$$

Because $g_l(x)|C(x)$ and $\gcd(g_l(x), x^i)=1$, $g_l(x)|C'(x)$ is satisfied if and only if $$g_l(x) \left| \left( (1+x^i)f_l(x) + \sum_{s=0}^{i-1} \overline{p_s} x^s \right) \right.$$

Further, $$\deg\left( \text{remainder of}\left( \frac{(1+x^i)f_l(x)}{g_l(x)} \right) \right) \geq i - j$$

(condition (2) above), and $$\deg\left( \sum_{s=0}^{i-1} \overline{p_s} x^s \right) < i - j$$

because $\overline{p_{i-1}}, \overline{p_{i-2}}, \ldots, \overline{p_{i-j}}$ must all be 0 for the path metric test to pass. Therefore, $$\deg\left( \text{remainder of}\left( \frac{\left( (1+x^i)f_l(x) + \sum_{s=0}^{i-1} \overline{p_s} x^s \right)}{g_l(x)} \right) \right) \geq i - j,$$

and $g_l(x)$ does not divide $$(1+x^i)f_l(x) + \sum_{s=0}^{i-1} \overline{p_s} x^s.$$

Therefore, the probability of a false detection is 0.

In view of the above, the probability of a false detection is 0 when $0 < i \leq l+j-1$.

If $i \geq l+m$, then the guessed message block M' includes k-i bits, $m_{k-1}, m_{k-2}, \ldots, m_i$, the guessed flipped parity check block $\overline{P'}$ includes, $m_{i-1}, m_{i-2}, \ldots, m_{i-l}$, B' includes M' and $\overline{P'}$, followed by j bits, $m_{i-l-1} m_{i-l-2}, \ldots, m_{i-l-j}$. For the path metric test to pass, the last j bits of bit stream B' must all be 0, i.e., $m_{i-l-1}, m_{i-l-2}, \ldots, m_{i-l-j}$ are all 0's. Further, because there is only one possible parity check block corresponding to a certain message block M', there is only one possible flipped parity check block $\overline{P'}$ that corresponds to message block M'. Therefore, assuming message block M is uniformly distributed, the probability of $m_{i-1}, m_{i-2}, \ldots, m_{i-l}$ composing the flipped check parity block $\overline{P'}$ that corresponds to M' and $m_{i-l-1}, m_{i-l-2}, \ldots, m_{i-l-j}$ are all 0's is $2^{-(l+j)}$.

Figure 9:
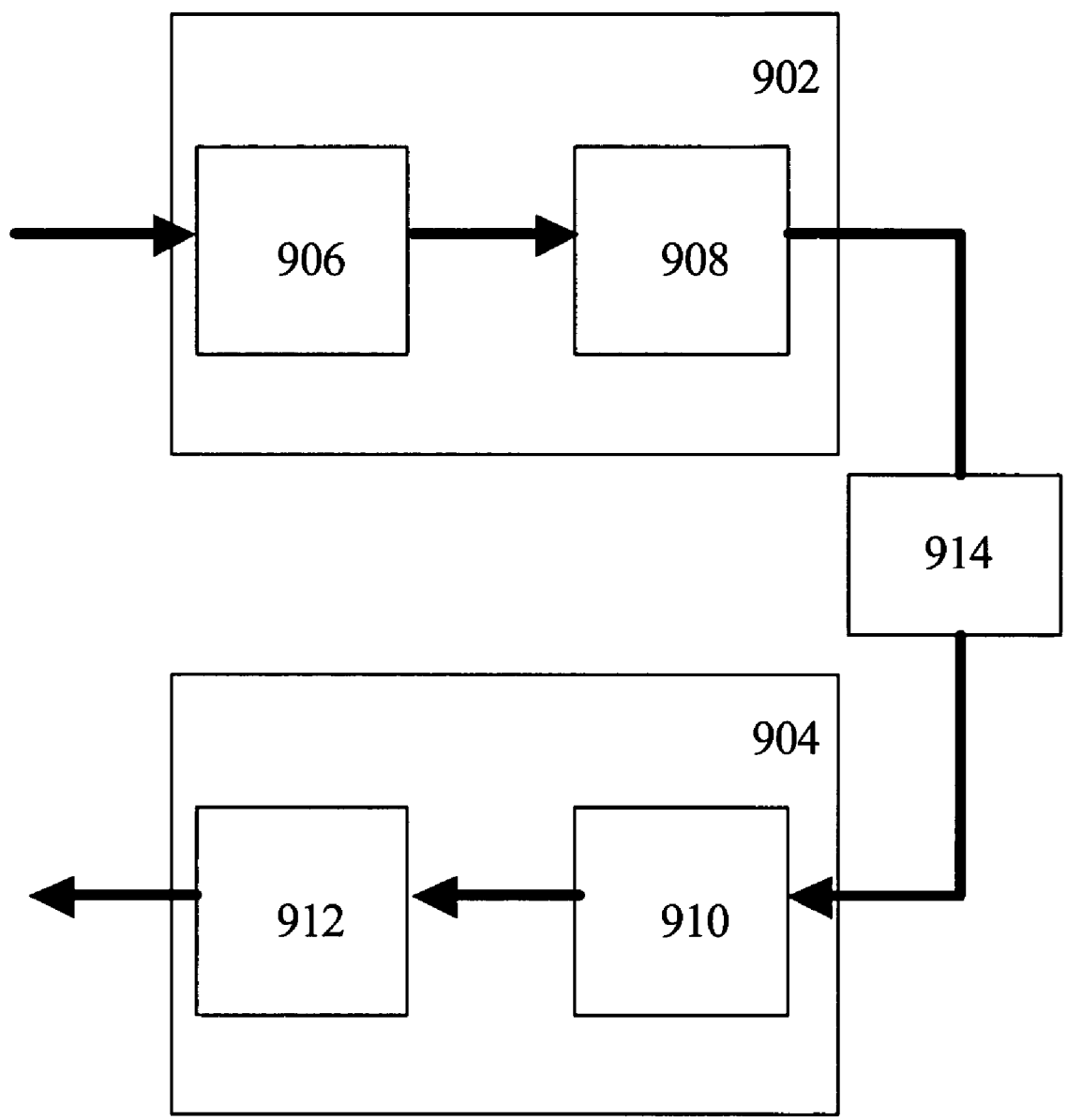
FIG. 9 shows a communication system that utilizes the flip-bit CRC coding method consistent with the present invention.

FIG. 9 shows a communication system 900 that utilizes the flip-bit CRC coding method consistent with the present invention. System 900 includes a transmitter 902 and a receiver 904. Transmitter 902 includes a flip-bit CRC encoder 906 and a convolutional encoder 908. Receiver 904 includes a convolutional decoder 910 and a flip-bit CRC decoder 912. Message blocks are sequentially encoded by flip-bit CRC encoder 906 and convolutional encoder 908, transmitted by transmitter 902, passed through a data channel 914, and sequentially decoded by convolutional decoder 910 and flip-bit CRC decoder 912.

Computer simulation has been carried out and simulation results are shown in FIGS. 10A–10B and 11A–11C.

Figure 10B:
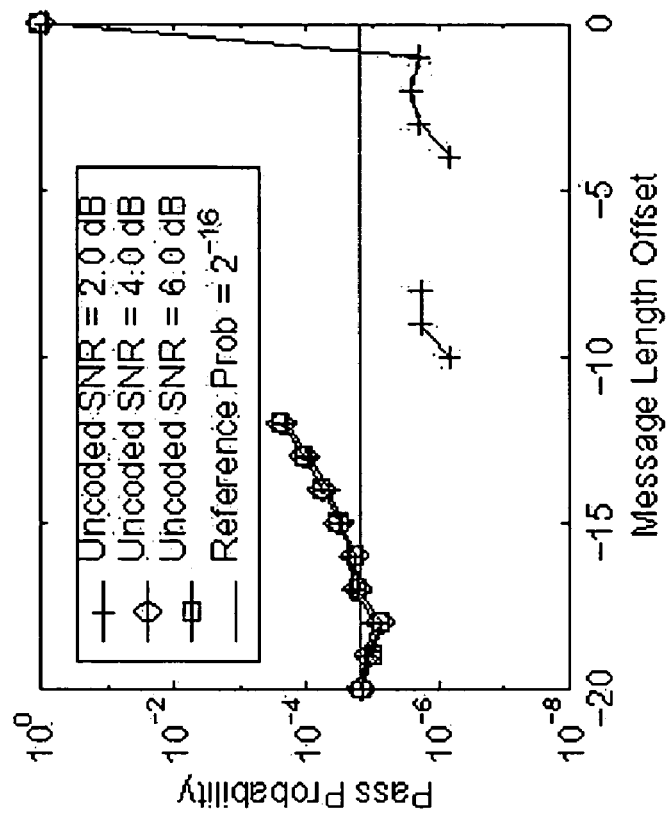
FIG. 10B shows the probability of passing both the path metric test and the CRC test with respect to the message length offset for the CRC method consistent with the present invention, assuming a flip polynomial that does not satisfy a condition consistent with the present invention.
Figure 10A:
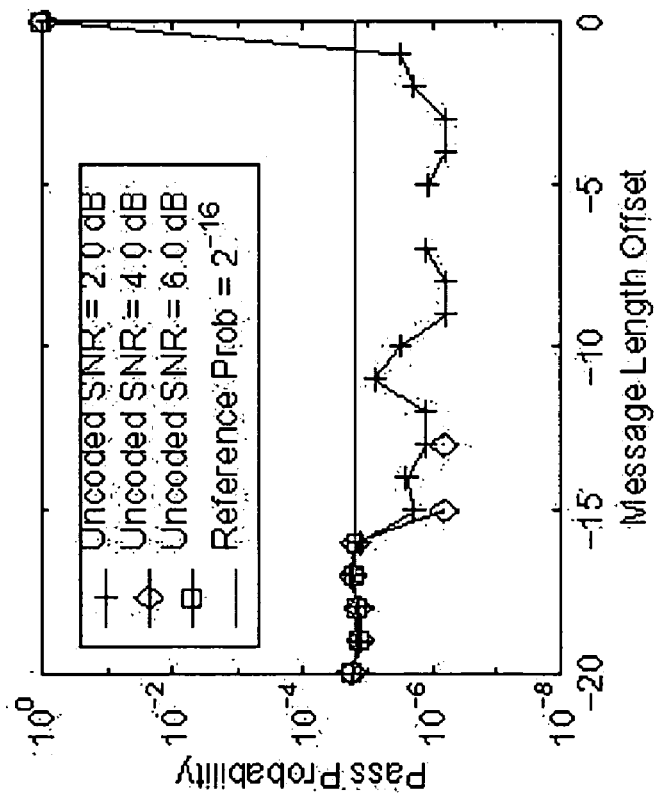
FIG. 10A shows the probability of passing both a path metric test and a CRC test with respect to a message length offset for the CRC method consistent with the present invention, assuming a flip polynomial that satisfies a condition consistent with the present invention.

FIG. 10A shows the probability of passing both the path metric test and the CRC test with respect to the message length offset for the CRC method consistent with the present invention, assuming an initial signal-to-noise ratio (SNR) of 2.0 dB, 4.0 dB, and 6.0 dB. It is assumed in FIG. 10A that a (2, 1, 8) convolutional coder is used, the order of the CRC generating polynomial is 8, $g_8(x)=x^8+x^7+x^4+x^3+x+1$, $f_8(x)=x^4+x$, and the actual message length is 30. $f_8(x)=x^4+x$ satisfies condition (1). As shown in FIG. 10A, when the SNR is high such as 6.0 dB, no false detection occurs when the message length offset is less than l+j=16. Even with a poor SNR such as 2.0 dB or 4.0 dB, the probability of a false detection when the message length offset is less than 16 is significantly lower than $2^{-(l+j)}=2^{-16}$.

FIG. 10B illustrates the effect when the flip polynomial fails to satisfy condition (1). FIG. 10B is the simulation result based on the same assumptions as FIG. 10A except that the flip polynomial is $f_8(x)=x^7+1$, which does not satisfy condition (1). Consequently, the probability of false detection is much higher.

Figure 11B:
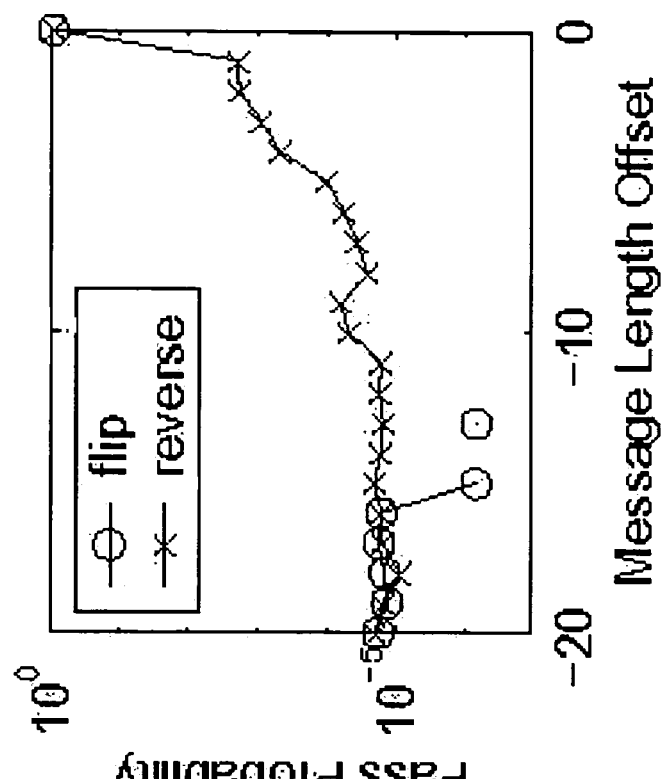
FIGS. 11A–11C compares the performance of the CRC method consistent with the present invention and the conventional modification method.
Figure 11A:
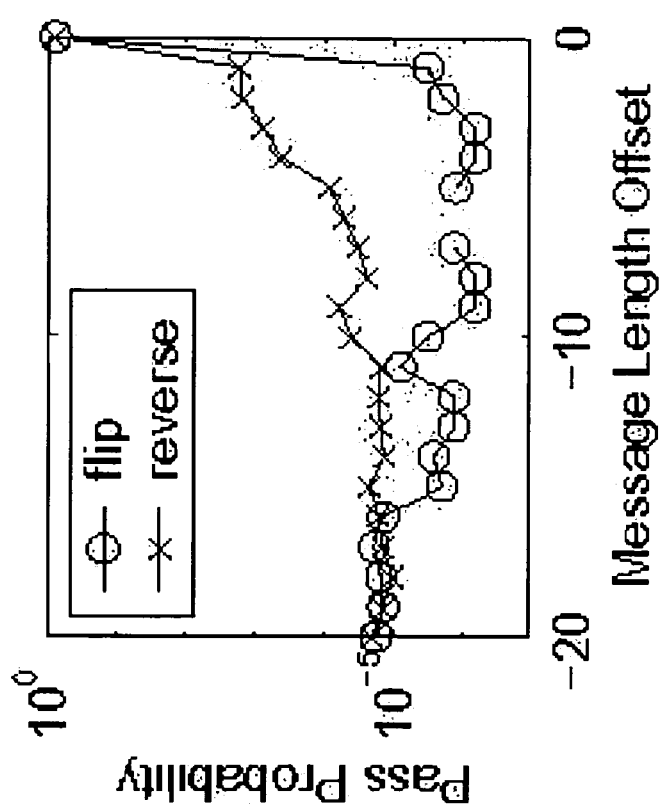
Figure 11C:
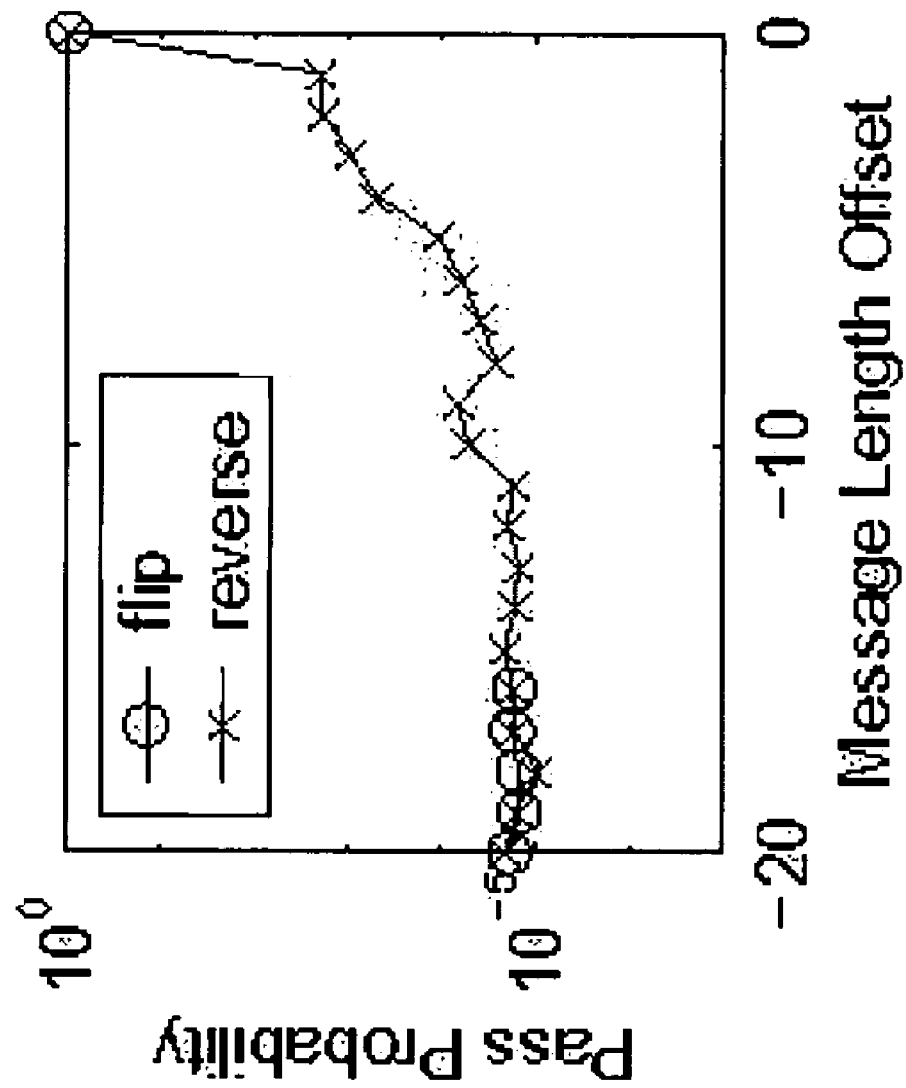

FIGS. 11A–11C compare the performance of the CRC method consistent with the present invention and the conventional modification method, where the circles represent the flip-bit CRC method consistent with the present invention, and the cross symbols represent the conventional modification method. It is assumed in FIGS. 11A–11C that a (2, 1, 8) convolutional coder is used, the order of the CRC generating polynomial is 8, $g_8(x)=x^8+x^7+x^4+x^3+x+1$, $f_8(x)=x^4+x$, and the actual message length is 30. FIG. 11A shows the comparison when the SNR is 2.0 dB. FIG. 11B shows the comparison when the SNR is 4.0 dB. FIG. 11C shows the comparison when the SNR is 6.0 dB. As shown in FIGS. 11A–11C, the CRC method consistent with the present invention has a better performance than the conventional modification method when the message length offset is smaller than l+j.

As discussed above, when a message block M' is guessed, the convolutional decoder determines whether D', which includes the first $n(\tilde{k}+l+j)$ bits of the received data bit stream, passes the path metric test, which requires 1) that D' must have the best path metric among those $2^{\tilde{k}+l+j}$ possible code words each corresponding to a message block length of $\tilde{k}$, and 2) D' must correspond to an all-zero end state of the coder, i.e., the coder returns to the all-zero state after encoding C'. The path metric test under these requirements is very strict and may result in a failure to detect a correct message block, as a code word D corresponding to a correct message block M may fail this test. Therefore, it is sometimes desirable to relax the test, as discussed next.

Figure 12B:
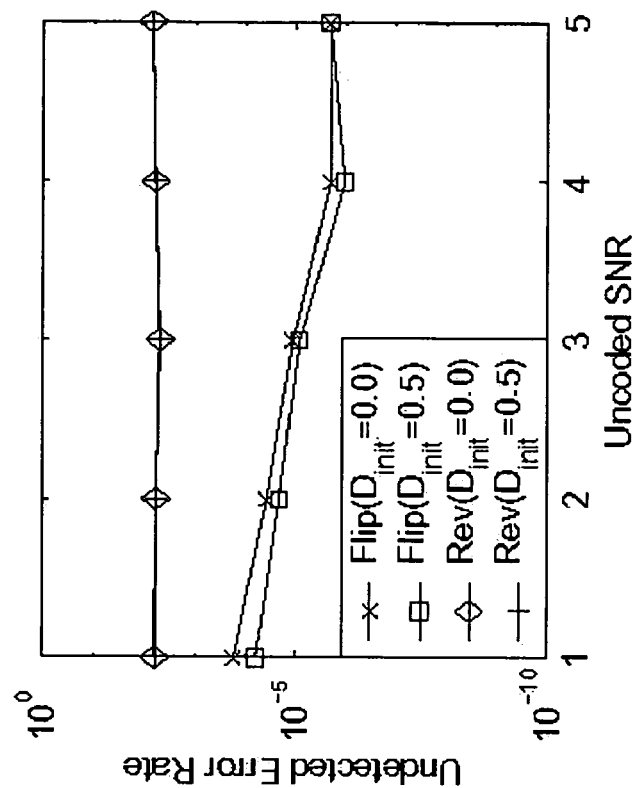
FIG. 12B shows simulation results of the probability of a false detection for the flip-bit CRC method consistent with the present invention and the conventional modification method.
Figure 12A:
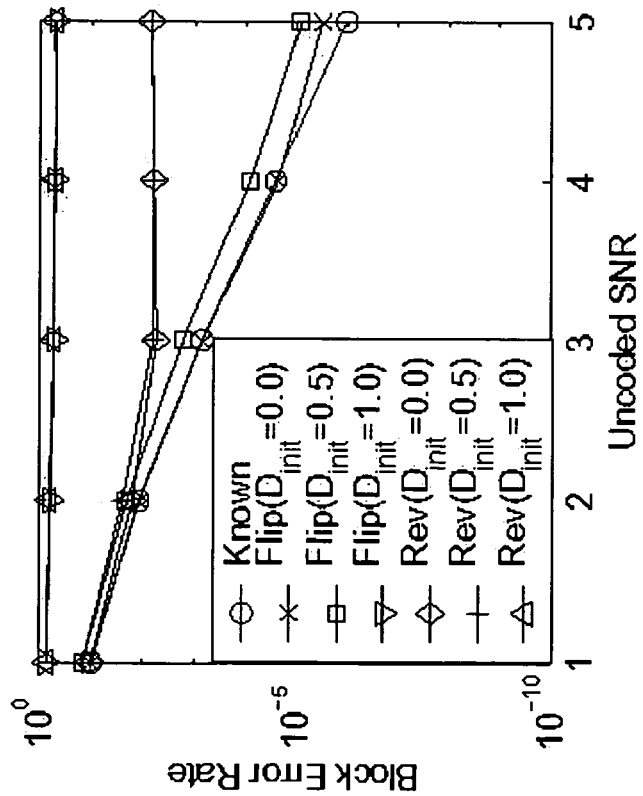
FIG. 12A shows simulation results of the probability of failing to detect the correct message block for the CRC method consistent with the present invention and the conventional modification method.

To quantize the relaxation of the path metric test, a relative path metric d is defined as $$d = \frac{\lambda_0 - \lambda_{\min}}{\lambda_{\max} - \lambda_{\min}},$$

and a pre-determined threshold $D_{init}$ is selected such that $0 \leq D_{init} \leq 1$, wherein $\lambda_0$ is the path metric of the code word corresponding to an all-zero end state, $\lambda_{max}$ is the maximum path metric, and $\lambda_{min}$ is the minimum path metric. According to the relaxed path metric test, if D' corresponds to an all-zero end state of the coder and $d \geq D_{init}$, then D' is considered to contain the correct message block. Apparently, the strict path metric test is the special instance of $D_{init}=1$. FIG. 12A shows simulation results of the probability of failing to detect the correct message block ("Block Error Rate") with respect to the initial SNR ("Uncoded SNR") and a comparison between the flip-bit CRC method consistent with the present invention and the conventional modification method for different values of $D_{init}$ including 0.0, 0.5, and 1.0. FIG. 12B shows simulation results of the probability of a false detection ("Undetected Error Rate") with respect to the initial SNR ("Uncoded SNR") and a comparison between the flip-bit CRC method consistent with the present invention and the conventional modification method for different values of $D_{init}$ including 0.0 and 0.5. As shown in FIG. 12A, when $D_{init}$ is set to 1 (corresponding to the strict path metric test), there is a significantly high probability of the flip-bit CRC method failing to find any message block that satisfies both the path metric test and the CRC test. FIG. 12A also shows that the probability of the flip-bit CRC method failing to find any message block is slightly higher than the case when the message block length is known (represented by the circles) when $D_{init}$ is 0.0 or 0.5. As shown in 12B, when $D_{init}$ is set to smaller numbers such as 0.0 or 0.5, the probability of a false detection rises to prohibitive levels when the SNR is moderate (such as 4.0 dB) or lower. Thus, by choosing an appropriate CRC generating polynomial, an appropriate flip polynomial, and an appropriate $D_{init}$, the flip-bit CRC method consistent with the present invention may achieve error detection capabilities in a variable-length system commensurate with that in a system where the length of message blocks is known.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for a variable-length communications system, wherein messages to be transmitted are divided into variable-length message blocks and the system includes a convolutional encoder of a memory order j, wherein j is an integer, the method comprising:

providing a cyclic redundancy check (CRC) generating polynomial $g_l(x)$, wherein l is an integer and is the order of $g_l(x)$;

providing a binary flip polynomial $f_l(x)$ having an order of l−1, wherein $f_l(x)=f_{l-1}x^{l-1}+f_{l-2}x^{l-2}+\ldots+f_0$; and encoding a message block M of a message to be transmitted, wherein M includes k binary bits, $m_{k-1}$, $m_{k-2}, \ldots, m_0$, and wherein encoding M includes generating a parity check bit stream P, wherein P includes l parity check bits, $p_{l-1}, p_{l-2}, \ldots, p_0$, such that $g_l(x)|(x^lM(x)+P(x))$, wherein $M(x)=m_{k-1}x^{k-1}+m_{k-2}x^{k-2}+\ldots+m_0$, and $P(x)=p_{l-1}x^{l-1}+p_{l-2}x^{l-2}+\ldots+p_0$, flipping the parity check bit stream P to generate a flipped parity check bit stream $\overline{P}$ including l flipped parity check bits $\overline{p_{l-1}}, \overline{p_{l-2}}, \ldots, \overline{p_0}$, such that $\overline{p_{l-1}}=p_{l-1}+f_{l-1}$, $\overline{p_{l-2}}=p_{l-2}+f_{l-2}, \ldots, \overline{p_0}=p_0+f_0$, wherein "+" is a modulo-2 addition operation, appending the flipped parity check bit stream $\overline{P}$ to the end of message block M to create a concatenated bit stream C, such that C includes k+l bits, $m_{k-1}, m_{k-2}, \ldots, m_0$, $\overline{p_{l-1}}, \overline{p_{l-2}}, \ldots, \overline{p_0}$, and convolutionally encoding the concatenated bit stream C to generate a code word D.

2. The method of claim 1, wherein CRC generating polynomial $g_l(x)$ is chosen such that $\gcd(g_l(x),x^i)=1$ for $0 \leq i \leq l$, wherein i is an integer.

3. The method of claim 1, wherein flip polynomial $f_l(x)$ is chosen such that $$deg\left(\text{remainder of}\left(\frac{(1+x^j)f_l(x)}{g_l(x)}\right)\right) \geq i-j, \text{ for } 1 \leq i \leq l+j-1,$$

wherein i is an integer.

4. The method of claim 1, further comprising repeating the encoding to create a code word for each message block of the messages to be transmitted and transmitting the code words in series.

5. The method of claim 1, wherein the convolutional coder is an (n, t, j) convolutional coder, where n is an integer representing how many bits are output at a time by the coder, t is an integer indicating the number of inputs the coder receives, and j is the memory order of the coder.

6. The method of claim 5, wherein t=1, and wherein convolutionally encoding comprises generating the code word D including n(k+l+j) bits.

7. The method of claim 1, wherein convolutionally encoding comprises appending j bits of 0's to the end of the concatenated bit stream C to create a 0-terminated bit stream B, such that B includes k+l+j bits, $m_{k-1}, m_{k-2}, \ldots, m_0, \overline{p_{l-1}}, \overline{p_{l-2}}, \ldots, \overline{p_0}, 0, 0, \ldots, 0$ (j bits of 0 at the end), and encoding the 0-terminated bit stream B to generate the code word D.

8. The method of claim 7, wherein the convolutional coder is in an all-zero state prior to and after the convolutional encoding process.

9. A method for a variable-length communications system, wherein the system includes a receiver, the method comprising:

storing in the receiver information of a cyclic redundancy check (CRC) generating polynomial $g_l(x)$, wherein l is an integer and is the order of $g_l(x)$, and information of a flip polynomial $f_l(x)$ having an order of l−1;

receiving a data bit stream including a plurality of code words, wherein the code words are coded with a convolutional coder of a memory order j, wherein j is an integer, each code word corresponding to a concatenated bit stream consisting of a message block and a corresponding flipped parity check bit stream; and decoding a first message block in the data bit stream, including (a) guessing a message block length $\hat{k}$ and generating a concatenated bit stream C' from the first n($\hat{k}$+l+j) bits of the received data bit stream, the concatenated bit stream C' including a guessed message block M' consisting of $\hat{k}$ bits, $m'_{\hat{k}-1}, m'_{\hat{k}-2}, \ldots, m'_0$, wherein $\hat{k}$ is an integer, and a guessed flipped bit stream P' including l bits, (b) generating a parity check bit stream $\hat{P}$ including l parity check bits, $\hat{p}_{l-1}, \hat{p}_{l-2}, \ldots, \hat{p}_0$, such that $g_l(x)|(x^j M'(x)+\hat{P}(x))$, wherein $M'(x)=m'_{\hat{k}-1}x^{\hat{k}-1}+m'_{\hat{k}-2}x^{\hat{k}-2}+\ldots+m'_0$, and $\hat{P}(x)=\hat{p}_{l-1}x^{l-1}+\hat{p}_{l-2}x^{l-2}+\ldots+\hat{p}_0$, (c) flipping the parity check bit stream $\hat{P}$ using flip polynomial $f_l(x)$ to generate a flipped parity check bit stream $\hat{P}'$ including l flipped parity check bits, $\hat{p}'_{l-1}$, $\hat{p}'_{l-2}, \ldots, \hat{p}'_0$, and (d) if P' and $\hat{P}'$ are different, increasing $\hat{k}$ by 1 and repeating (a)–(c).

10. The method of claim 9, wherein CRC generating polynomial $g_l(x)$ satisfies $\gcd(g_l(x),x^i)=1$ for $0 \leq i \leq 1$, wherein i is an integer.

11. The method of claim 9, wherein flip polynomial $f_l(x)$ is chosen such that $$deg\left(\text{remainder of}\left(\frac{(1+x^i)f_l(x)}{g_l(x)}\right)\right) \geq i-j, \text{ for } 1 \leq i \leq l+j-1,$$

wherein i is an integer.

12. The method of claim 9, wherein the length of the first message block is k, wherein k is an integer, and an initial value of $\hat{k}$ is not greater than k.

13. The method of claim 9, wherein the flipped parity check bit stream $\hat{P}'$ is generated such that $\hat{p}'_{l-1}=\hat{p}_{l-1}+f_{l-1}$, $\hat{p}'_{l-2}=\hat{p}_{l-2}+f_{l-2}, \ldots, \hat{p}'_0=\hat{p}_0+f_0$, wherein "+" is a modulo-2 addition operator.

14. The method of claim 9, wherein decoding the first message block further comprising removing the first n($\hat{k}$+l+j) bits from the data bit stream when P'=$\hat{P}'$.

15. The method of claim 14, further comprising repeating decoding the first message block in the data bit stream after the first n($\hat{k}$+l+j) bits are removed.

16. The method of claim 9, wherein the code words are coded with an (n, t, j) convolutional coder, where n is an integer representing how many bits are output at a time by the coder, t is an integer indicating the number of inputs the coder receives, and j is the memory order of the coder.

17. The method of claim 9, wherein guessing the message block length $\hat{k}$ comprises finding a best one of $2^{\hat{k}+l+j}$ possible code words corresponding to the guessed message block length $\hat{k}$ such that the best code word has a best path metric with respect to the first n($\hat{k}$+l+j) bits of the received data bit stream, if the best code word corresponds to an all-zero end state of the convolutional coder, continuing with the generating of the parity check bit stream $\hat{P}$, and if the best code word does not correspond to an all-zero end state of the convolutional coder, increasing $\hat{k}$ by 1 and returning to the finding of a best one of $2^{\hat{k}+l+j}$ possible code words.

18. The method of claim 9, wherein guessing the message block length $\hat{k}$ comprises finding a one of $2^{\hat{k}+l+j}$ possible code words corresponding to the guessed message block length $\hat{k}$ such that the one code word corresponds to an all-zero state of the convolutional coder, if $$d = \frac{\lambda_0 - \lambda_{min}}{\lambda_{max} - \lambda_{min}} \geq D_{init},$$

continuing with the generating of the parity check bit stream $\hat{P}$, wherein $D_{init}$ is a pre-determined threshold having a value between 0 and 1, inclusive, $\lambda_0$ is a path metric of the one code word with respect to the first n($\hat{k}$+l+j) bits of the received data bit stream, $\lambda_{max}$ is a maximum one of all path metrics of the $2^{\hat{k}+l+j}$ possible code words with respect to the first n($\hat{k}$+l+j) bits of the received data bit stream, and $\lambda_{min}$ is a minimum one of all path metrics of the $2^{\hat{k}+l+j}$ possible code words with respect to the first n($\hat{k}$+l+j) bits of the received data bit stream, and if $$d = \frac{\lambda_0 - \lambda_{min}}{\lambda_{max} - \lambda_{min}} < D_{init},$$

increasing $\hat{k}$ by 1 and repeating the above steps.

19. The method of claim 18, further comprising:

selecting an appropriate value of $D_{init}$; and storing the appropriate value of $D_{init}$ in the receiver.

20. A method for a variable-length communications system, wherein the system includes a transmitter and a receiver, the transmitter includes a convolutional coder of a memory order j, wherein j is an integer, wherein messages are divided into variable-length message blocks, the method comprising:

providing a cyclic redundancy check (CRC) generating polynomial $g_l(x)$, wherein l is an integer and is the order of $g_l(x)$;

providing a binary flip polynomial $f_l(x)$ having an order of l-1;

storing in both the transmitter and the receiver information of CRC generating polynomial $g_l(x)$ and information of flip polynomial $f_l(x)$;

encoding a message to be transmitted by encoding each message block M thereof, wherein encoding M includes generating a parity check bit stream P using the CRC generating polynomial $g_l(x)$, flipping the parity check bit stream P to generate a flipped parity check bit stream $\overline{P}$ using flip polynomial $f_l(x)$, appending the flipped parity check bit stream $\overline{P}$ to the end of the message block M to create a concatenated bit stream C, and convolutionally encoding the concatenated bit stream C to generate a code word D with the convolutional coder; and transmitting the code words D of the message blocks M of the message to be transmitted;

receiving a data bit stream including a plurality of code words, each code word corresponding to a concatenated bit stream consisting of a message block and a corresponding flipped parity check bit stream; and decoding the data bit stream, including decoding a first message block in the data bit stream, including (a) guessing a message block length $\hat{k}$ and generating a concatenated bit stream C' from the first n($\hat{k}$+l+j) bits of the received data bit stream, the concatenated bit stream C' including a guessed message block M' having $\hat{k}$ bits, $m'_{\hat{k}-1}, m'_{\hat{k}-2}, \ldots, m'_0$, wherein $\hat{k}$ is an integer, and a guessed flipped bit stream P' including l bits, (b) generating a parity check bit stream $\hat{P}$ using CRC generating polynomial $g_l(x)$, (c) flipping the parity check bit stream $\hat{P}$ using flip polynomial $f_l(x)$ to generate a flipped parity check bit stream $\hat{P}'$, (d) if $P'$ and $\hat{P}'$ are different, increasing $\hat{k}$ by 1 and repeating (a)–(c), and (e) removing the first $n(\hat{k}+l+j)$ bits from the data bit stream when $P'=\hat{P}'$, and repeating the decoding of the first message block in the data bit stream after the first $n(\hat{k}+l+j)$ bits are removed.

21. The method of claim 20, wherein CRC generating polynomial $g_l(x)$ is chosen such that $\gcd(g_l(x),x^i)=1$ for $0 \leq i \leq l$, wherein i is an integer.

22. The method of claim 21, wherein the parity check bit stream $\hat{P}$ includes l bits, $\hat{p}_{l-1}, \hat{p}_{l-2}, \ldots, \hat{p}_0$, and is generated such that $g_l(x) | (x^l M'(x)+\hat{P}(x))$, wherein $M'(x)=m'_{\hat{k}-1}x^{\hat{k}-1}+m'_{\hat{k}-2}x^{\hat{k}-2}+\ldots+m'_0$, and $\hat{P}(x)=\hat{p}_{l-1}x^{l-1}+\hat{p}_{l-2}x^{l-2}+\ldots+\hat{p}_0$.

23. The method of claim 20, wherein flip polynomial $f_l(x)$ is chosen such that $$deg\left(\text{remainder of}\left(\frac{(1+x^i)f_l(x)}{g_l(x)}\right)\right) \geq i-j, \text{ for } 1 \leq i \leq l+j-1,$$

wherein i is an integer.

24. The method of claim 23, wherein the parity check bit stream $\hat{P}$ includes l bits, $\hat{p}_{l-1}, \hat{p}_{l-2}, \ldots, \hat{p}_0$, wherein the flipped parity check bit stream includes $\hat{P}'$ including l flipped parity check bits, $\hat{p}'_{l-1}, \hat{p}'_{l-2}, \ldots, \hat{p}'_0$, and wherein the flipped parity check bit stream $\hat{P}'$ is generated such that $\hat{p}'_{l-1}=\hat{p}_{l-1}+f_{l-1}, \hat{p}'_{l-2}=\hat{p}_{l-2}+f_{l-2}, \ldots, \hat{p}'_0=\hat{p}_0+f_0$, wherein "+" is a modulo-2 addition operator.

25. The method of claim 20, wherein the convolutional coder is an (n, t, j) convolutional coder, where n is an integer representing a number of bits output at a time by the coder, t is an integer indicating the number of inputs the coder receives, and j is the memory order of the coder.

26. The method of claim 25, wherein t=1, and wherein convolutionally encoding comprises generating the code word D including n(k+l+j) bits.

27. The method of claim 20, wherein convolutionally encoding comprises
appending j bits of 0's to the end of the concatenated bit stream C to create a 0-terminated bit stream B, and
encoding the 0-terminated bit stream B to generate the code word D.

28. The method of claim 27, wherein the convolutional coder is in an all-zero state prior to and after the convolutional encoding process.

29. The method of claim 20, wherein the length of the first message block in the data bit stream is k, wherein k is an integer, and an initial value of $\hat{k}$ is not greater than k.

30. The method of claim 20, wherein guessing the message block length $\hat{k}$ comprises
finding a best one of $2^{\hat{k}+l+j}$ possible code words corresponding to the guessed message block length $\hat{k}$ such that the best code word has a best path metric with respect to the first $n(\hat{k}+l+j)$ bits of the received data bit stream,
if the best code word corresponds to an all-zero end state of the convolutional coder, continuing with the generating of the parity check bit stream $\hat{P}$, and
if the best code word does not correspond to an all-zero end state of the convolutional coder, increasing $\hat{k}$ by 1 and returning to the finding of a best one of $2^{\hat{k}+l+j}$ possible code words.

31. The method of claim 20, wherein guessing the message block length $\hat{k}$ comprises
finding a one of $2^{\hat{k}+l+j}$ possible code words corresponding to the guessed message block length $\hat{k}$ such that the one code word corresponds to an all-zero state of the convolutional coder,
if $$d = \frac{\lambda_0 - \lambda_{min}}{\lambda_{max} - \lambda_{min}} \geq D_{init},$$

continuing with the generating of the parity check bit stream $\hat{P}$, wherein $D_{init}$ is a pre-determined threshold having a value between 0 and 1, inclusive, $\lambda_0$ is a path metric of the one code word with respect to the first $n(\hat{k}+l+j)$ bits of the received data bit stream, $\lambda_{max}$ is a maximum one of all path metrics of the $2^{\hat{k}+l+j}$ possible code words with respect to the first $n(\hat{k}+l+j)$ bits of the received data bit stream, and $\lambda_{min}$ is a minimum one of all path metrics of the $2^{\hat{k}+l+j}$ possible code words with respect to the first $n(\hat{k}+l+j)$ bits of the received data bit stream, and
if $$d = \frac{\lambda_0 - \lambda_{min}}{\lambda_{max} - \lambda_{min}} < D_{init},$$

increasing $\hat{k}$ by 1 and repeating the above steps.

32. The method of claim 31, further comprising:
selecting an appropriate value of $D_{init}$; and
storing the appropriate value of $D_{init}$ in the receiver.

33. A method for a variable-length communications system, wherein messages to be transmitted are divided into variable-length message blocks, the method comprising:
providing a cyclic redundancy check (CRC) generating polynomial;
providing a binary flip polynomial; and
encoding a first one of the message blocks of a message to be transmitted, including
generating a parity check bit stream using the CRC generating polynomial,
flipping the parity check bit stream to generate a flipped parity check bit stream using the flip polynomial,
appending the flipped parity check bit stream to the end of the first one of the message blocks of the message to create a concatenated bit stream, and
convolutionally encoding the concatenated bit stream to generate a code word.

34. The method of claim 33, wherein the CRC generating polynomial is denoted $g_l(x)$, wherein l is an integer and is the order of $g_l(x)$, $g_l(x)$ is chosen such that $\gcd(g_l(x),x^i)=1$ for $0 \leq i \leq l$, wherein i is an integer.

35. The method of claim 34, wherein the flip polynomial is denoted $f_l(x)$ and is chosen such that $$deg\left(\text{remainder of}\left(\frac{(1+x^i)f_l(x)}{g_l(x)}\right)\right) \geq i-j, \text{ for } 1 \leq i \leq l+j-1,$$

wherein i is an integer.

36. The method of claim 33, further comprising repeating the generating of a parity check bit stream, the flipping of the parity check bit stream, the appending of the flipped parity check bit stream, and the convolutionally encoding of the concatenated bit stream to generate a code word for each one of the message blocks of the message and transmitting the code words in series.

37. A method for a variable-length communications system, wherein the system includes a receiver, the method comprising:
storing in the receiver information of a cyclic redundancy check (CRC) generating polynomial and a flip polynomial;
receiving a data bit stream including a plurality of code words, each code word corresponding to a concatenated bit stream consisting of one of message blocks of a message and a corresponding flipped parity check bit stream; and
decoding a first one of the message blocks of the message in the data bit stream, including
(a) guessing a message block length of the first one of the message blocks and generating a concatenated bit stream from the received data bit stream, the concatenated bit stream including a guessed flipped parity check bit stream,
(b) generating a parity check bit stream from the concatenated bit stream using the CRC generating polynomial,
(c) flipping the parity check bit stream using the flip polynomial to generate a flipped parity check bit stream,
(d) if the flipped parity check bit stream and the guessed flipped parity check bit stream are different, increasing the guessed message block length by 1 and repeating (a)–(c), and
(e) if the flipped parity check bit stream and the guessed flipped parity check bit stream are the same, removing the code word corresponding to the first one of the message blocks of the message from the data bit stream.

38. The method of claim 37, wherein the CRC generating polynomial is denoted $g_l(x)$, wherein l is an integer and is the order of $g_l(x)$, $g_l(x)$ is chosen such that $\gcd(g_l(x),x^i)=1$ for $0 \leq i \leq l$, wherein i is an integer.

39. The method of claim 38, wherein the flip polynomial is denoted $f_l(x)$ and is chosen such that $$deg\left(\text{remainder of}\left(\frac{(1+x^i)f_l(x)}{g_l(x)}\right)\right) \geq i - j, \text{ for } 1 \leq i \leq l + j - 1,$$

wherein i is an integer.

40. The method of claim 37, further comprising repeating the decoding of the first message block in the data bit stream to decode other message blocks of the message.

41. The method of claim 37, wherein guessing the message block length of the first one of the message blocks comprises
finding a best one of all possible code words corresponding to the guessed message block length such that the best code word has a best path metric,
if the best code word corresponds to an all-zero end state, continuing with the generating of the parity check bit stream, and
if the best code word does not correspond to an all-zero end state of the convolutional coder, increasing the guessed message block length by 1 and returning to the finding of a best one of all possible code words.

42. The method of claim 37, wherein guessing the message block length of the first one of the message blocks comprises
finding a one of all possible code words corresponding to an all-zero state,
if a path metric of the one code word satisfies a predetermined condition, continuing with the generating of the parity check bit stream, and
if a path metric of the one code word does not satisfy the predetermined condition, increasing the guessed message block length by 1 and returning to the finding of a best one of all possible code words.

43. The method of claim 42, wherein the predetermined condition is defined as $$d = \frac{\lambda_0 - \lambda_{\min}}{\lambda_{\max} - \lambda_{\min}} \geq D_{init},$$

wherein $D_{init}$ is a pre-determined threshold having a value between 0 and 1, inclusive, $\lambda_0$ is a path metric of the one code word, $\lambda_{max}$ is a maximum one of all path metrics of all the possible code words, and $\lambda_{min}$ is a minimum one of all path metrics of all the possible code words.

44. A method for a variable-length communications system, wherein the system includes a transmitter and a receiver, wherein messages are divided into variable-length message blocks, the method comprising:
providing a cyclic redundancy check (CRC) generating polynomial;
providing a binary flip polynomial;
storing in both the transmitter and the receiver information of the CRC generating polynomial and information of the flip polynomial;
encoding a message to be transmitted by encoding each message block thereof, wherein encoding each message block includes
generating a parity check bit stream using the CRC generating polynomial,
flipping the parity check bit stream to generate a flipped parity check bit stream using the flip polynomial,
appending the flipped parity check bit stream to the end of the corresponding message block to create a concatenated bit stream, and
convolutionally encoding the concatenated bit stream to generate a code word; and
transmitting the code words of the message blocks of the message to be transmitted;
receiving a data bit stream corresponding to a message received including a plurality of message blocks, the data bit stream including a plurality of code words, each code word corresponding to a concatenated bit stream consisting of a corresponding one of the message blocks of the message received and a corresponding flipped parity check bit stream; and
decoding the data bit stream by decoding each of the message blocks of the message received, wherein decoding each of the message blocks including
(a) guessing a message block length and generating a concatenated bit stream from the received data bit stream, the concatenated bit stream including a guessed message block and a guessed flipped parity check bit stream,
(b) generating a parity check bit stream using the CRC generating polynomial, (c) flipping the parity check bit stream using the flip polynomial to generate a flipped parity check bit stream, (d) if the flipped parity check bit stream and the guessed flipped parity check bit stream are different, increasing the guessed message block length by 1 and repeating (a)–(c), and (e) if the flipped parity check bit stream and the guessed flipped parity check bit stream are the same, removing the code word of the corresponding message block from the data bit stream.

45. The method of claim 44, wherein the CRC generating polynomial is denoted $g_l(x)$, wherein l is an integer and is the order of $g_l(x)$, $g_l(x)$ is chosen such that $\gcd(g_l(x),x^i)=1$ for $0 \leq i \leq l$, wherein i is an integer.

46. The method of claim 45, wherein the flip polynomial is denoted $f_l(x)$ and is chosen such that $$deg\left(\text{remainder of}\left(\frac{(1+x^i)f_l(x)}{g_l(x)}\right)\right) \geq i - j, \text{ for } 1 \leq i \leq l+j-1,$$

wherein i is an integer.

47. The method of claim 44, wherein guessing the message block length comprises finding a best one of all possible code words corresponding to the guessed message block length such that the best code word has a best path metric, if the best code word corresponds to an all-zero end state, continuing with the generating of the parity check bit stream, and if the best code word does not correspond to an all-zero end state of the convolutional coder, increasing the guessed message block length by 1 and returning to the finding of a best one of all possible code words.

48. The method of claim 44, wherein guessing the message block length comprises finding a one of all possible code words corresponding to an all-zero state, if a path metric of the one code word satisfies a predetermined condition, continuing with the generating of the parity check bit stream, and if a path metric of the one code word does not satisfy the predetermined condition, increasing the guessed message block length by 1 and returning to the finding of a best one of all possible code words.

49. The method of claim 48, wherein the predetermined condition is defined as $$d = \frac{\lambda_0 - \lambda_{\min}}{\lambda_{\max} - \lambda_{\min}} \geq D_{init},$$

wherein $D_{init}$ is a pre-determined threshold having a value between 0 and 1, inclusive, $\lambda_0$ is a path metric of the one code word, $\lambda_{max}$ is a maximum one of all path metrics of all the possible code words, and $\lambda_{min}$ is a minimum one of all path metrics of all the possible code words.

50. A variable-length communications system, comprising a transmitter for encoding messages into a data bit stream and then transmitting the data bit stream, the messages being divided into variable-length message blocks, wherein encoding the messages includes encoding a message block of the messages, including generating a parity check bit stream using a CRC generating polynomial, flipping the parity check bit stream to generate a flipped parity check bit stream using a flip polynomial, appending the flipped parity check bit stream to the end of the corresponding message block to create a concatenated bit stream, and convolutionally encoding the concatenated bit stream to generate a code word;

a data channel for passing the data bit stream comprising the encoded messages; and a receiver for receiving the data bit stream and decoding the messages, wherein decoding the messages includes decoding a message block of the messages contained in the received data bit stream, including guessing a message block length, generating a concatenated bit stream from the received data bit stream, the concatenated bit stream including a guessed message block and a guessed flipped parity check bit stream, generating a parity check bit stream using the CRC generating polynomial, flipping the parity check bit stream using the flip polynomial to generate a flipped parity check bit stream, if the flipped parity check bit stream and the guessed flipped parity check bit stream are different, increasing the guessed message block length by 1 and returning to the generating of the concatenated bit stream, and if the flipped parity check bit stream and the guessed flipped parity check bit stream are the same, removing the code word of the corresponding message block from the data bit stream.

* * * * *